US012660461B2

(12) United States Patent
Kim et al.

(10) Patent No.: US 12,660,461 B2
(45) Date of Patent: Jun. 16, 2026

(54) DISPLAY DEVICE INCLUDING IRREGULARLY ARRANGED LIGHT EMITTING AREAS EMITTING SAME COLOR OF LIGHT

(71) Applicant: Samsung Display Co., Ltd., Yongin-Si (KR)

(72) Inventors: Sijin Kim, Yongin-si (KR); Seungjoo Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 281 days.

(21) Appl. No.: 18/232,856

(22) Filed: Aug. 11, 2023

(65) Prior Publication Data

US 2024/0057426 A1     Feb. 15, 2024

(30) Foreign Application Priority Data

Aug. 12, 2022    (KR) ........................ 10-2022-0101368

(51) Int. Cl.
H10K 59/35 (2023.01)
H10K 59/131 (2023.01)
H10K 59/38 (2023.01)

(52) U.S. Cl.
CPC ....... H10K 59/353 (2023.02); H10K 59/1315 (2023.02); H10K 59/38 (2023.02)

(58) Field of Classification Search
CPC ...... H10K 59/353; H10K 59/38; H10K 59/30; H10H 29/142
See application file for complete search history.

(56) References Cited

U.S. PATENT DOCUMENTS

| | | | |
|---|---|---|---|
| 2013/0027437 A1* | 1/2013 | Gu | G02F 1/134336 |
| | | | 345/204 |
| 2015/0070374 A1* | 3/2015 | Gong | G06T 11/001 |
| | | | 345/589 |
| 2017/0005151 A1* | 1/2017 | Kim | H10K 59/353 |
| 2019/0179065 A1 | 6/2019 | Kim et al. | |
| 2020/0058713 A1* | 2/2020 | Zhang | H10K 59/353 |
| 2021/0111363 A1* | 4/2021 | Hwang | H10K 50/125 |

(Continued)

FOREIGN PATENT DOCUMENTS

| | | |
|---|---|---|
| CN | 212625570 U | 2/2021 |
| CN | 112909058 A | 6/2021 |

(Continued)

*Primary Examiner* — Nduka E Ojeh
(74) *Attorney, Agent, or Firm* — Innovation Counsel LLP

(57) ABSTRACT

A display device includes a substrate, a first pixel and a second pixel. Each of the first pixel and the second pixel includes first, second and third light emitting areas. The second light emitting area is disposed adjacent to the first light emitting area in a first direction, and the third light emitting area is disposed adjacent to the first light emitting area in a second direction. The first light emitting area included in the first pixel and the first light emitting area included in the second pixel emit light of different colors, the second light emitting area included in the first pixel and the second light emitting area included in the second pixel emit light of different colors, and the third light emitting area included in the first pixel and the third light emitting area included in the second pixel emit light of different colors.

19 Claims, 22 Drawing Sheets

(56)        References Cited

U.S. PATENT DOCUMENTS

2021/0327972 A1 *  10/2021  Lou ..................... H10K 59/121
2021/0351246 A1     11/2021  Ren

FOREIGN PATENT DOCUMENTS

CN          113299727  A      8/2021
KR     10-2017-0003844  A      1/2017
KR     10-2017-0120488  A     10/2017
KR          10-1826432  B1      2/2018
KR     10-2019-0067955  A      6/2019

* cited by examiner

DDV

DATA

PNL

3500

1510
1520
1530

ELVDD,
ELVSS,
VINT

LA1 LA2 LA3

PX1

IDAT,
CTRL

CON

ODAT
DCTRL

GCTRL

GDV

Figure 13:
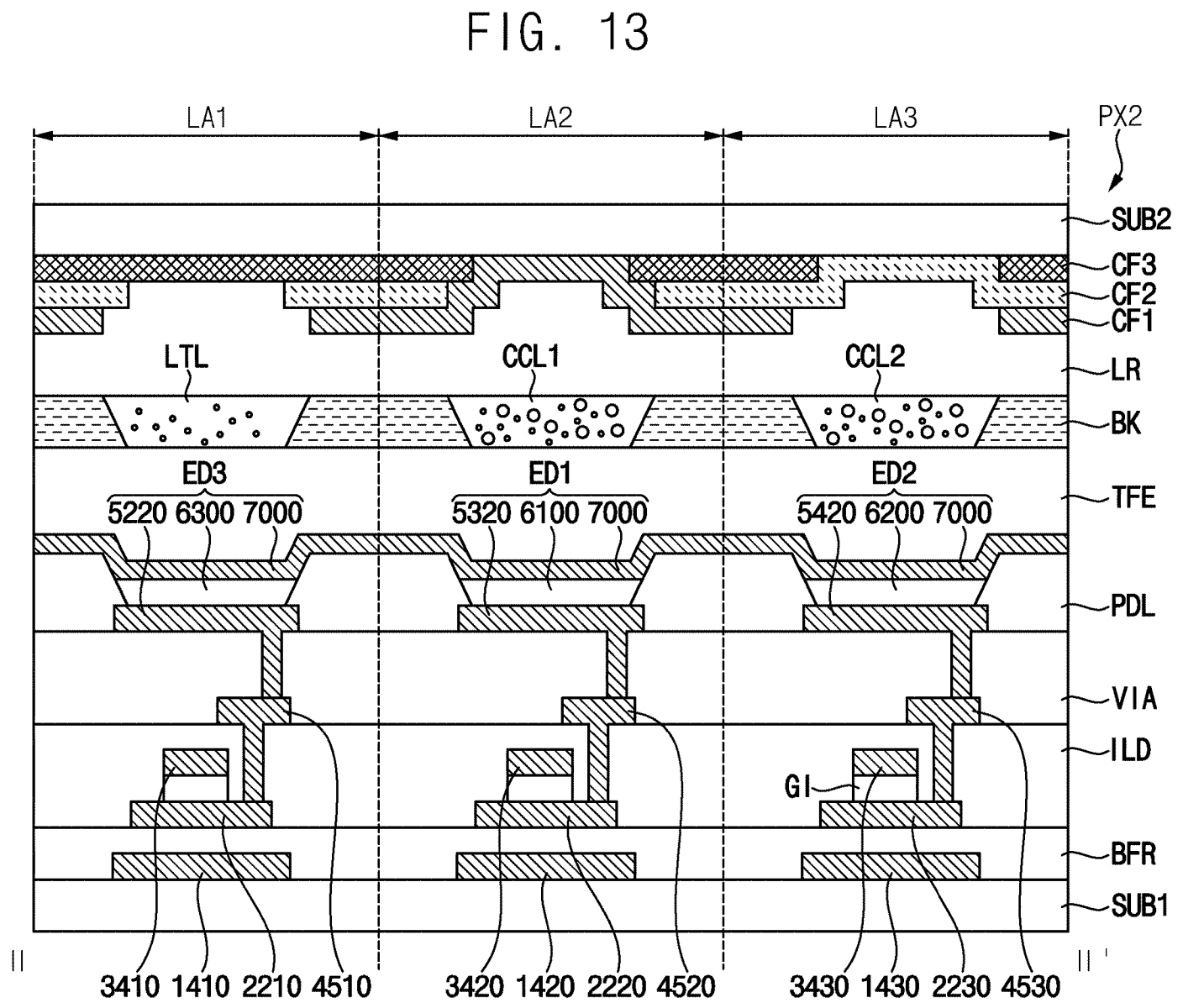

SUB2
CF3
CF2
CF1
LR
BK
TFE
PDL
VIA
ILD
BFR
SUB1

LA3

CCL2

ED2
5420 6200 7000

GI 3430 1430 2230 4530

LA2

CCL1

ED1
5320 6100 7000

3420 1420 2220 4520

LA1

LTL

Figure 16:
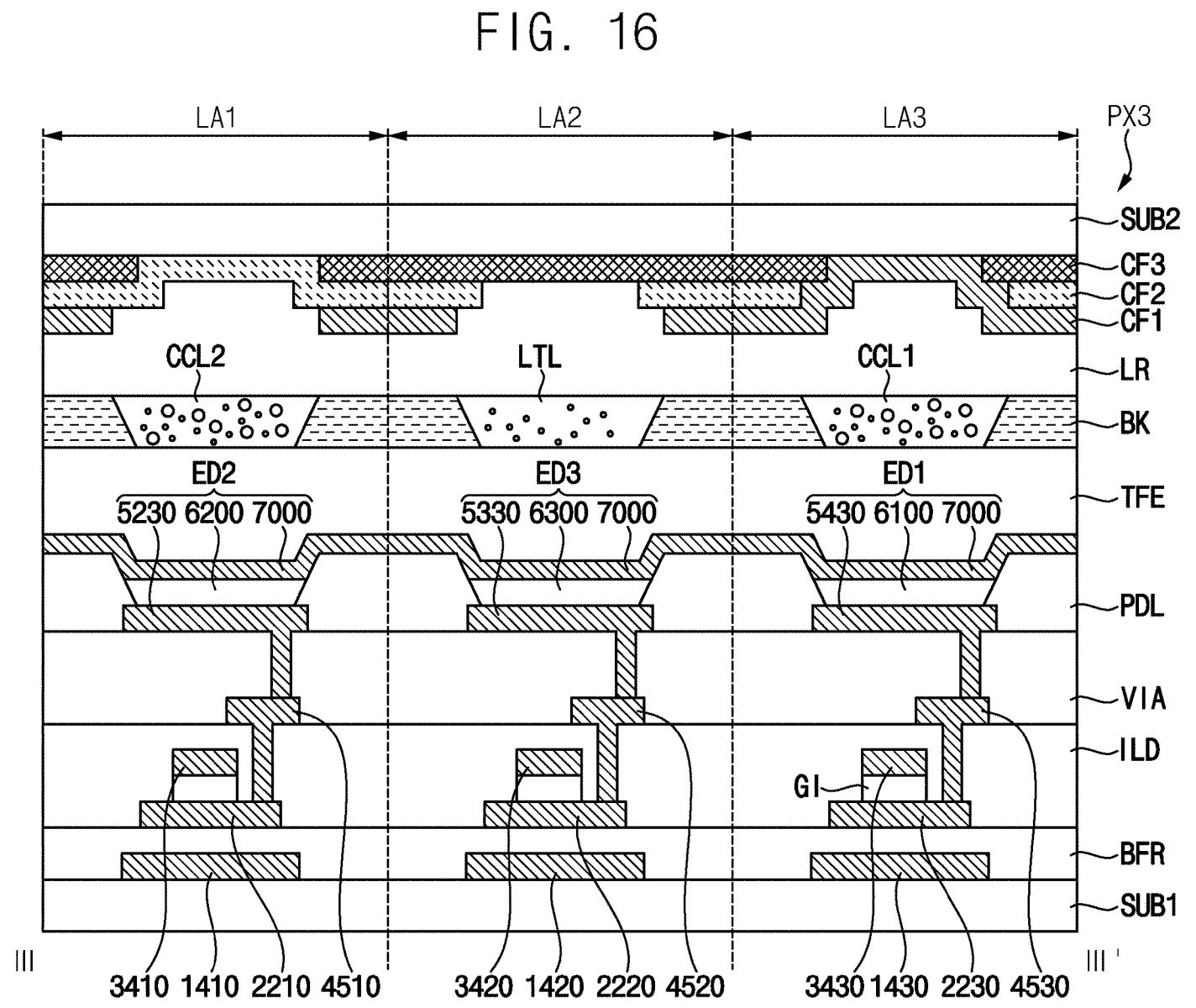

SUB2
CF3
CF2
CF1
LR
BK
TFE
PDL
VIA
ILD
BFR
SUB1

LA3

CCL1
ED1
5430 6100 7000
GI
3430 1430 2230 4530

LA2

LTL
ED3
5330 6300 7000
3420 1420 2220 4520

LA1

CCL2
ED2
5230 6200 7000
3410 1410 2210 4510

PNL

DISPLAY DEVICE INCLUDING IRREGULARLY ARRANGED LIGHT EMITTING AREAS EMITTING SAME COLOR OF LIGHT

CROSS-REFERENCE TO RELATED APPLICATION(S)

This application claims priority under 35 USC § 119 to Korean Patent Application No. 10-2022-0101368 filed on Aug. 12, 2022, in the Korean Intellectual Property Office (KIPO), the entire disclosure of which is incorporated by reference herein.

BACKGROUND

1. Field

Embodiments relate to a display device.

2. Description of the Related Art

The display device includes a transistor layer and a light emitting diode layer disposed on the transistor layer. The transistor layer has a structure in which a plurality of conductive patterns overlaps each other and generates a driving current. Light emitting diodes included in the light emitting diode layer receive the driving current and emit light. The conductive patterns and the light emitting diodes each constitute a light emitting area. As light emitting areas emitting light of the same color are regularly arranged, color tinting phenomenon occurs at the boundary of an image.

SUMMARY

Embodiments provide a display device with improved display quality.

A display device according to an embodiment may include a substrate, a first pixel disposed on the substrate, and a second pixel disposed on the substrate adjacent to the first pixel. Each of the first pixel and the second pixel may include a first light emitting area, a second light emitting area disposed adjacent to the first light emitting area in a first direction, and a third light emitting area disposed adjacent to the first light emitting area in a second direction crossing the first direction. The first light emitting area included in the first pixel and the first light emitting area included in the second pixel may emit light of different colors. The second light emitting area included in the first pixel and the second light emitting area included in the second pixel may emit light of different colors. The third light emitting area included in the first pixel and the third light emitting area included in the second pixel may emit light of different colors.

In an embodiment, the first light emitting area included in the first pixel and the second light emitting area included in the second pixel may emit light of the same color as each other. The second light emitting area included in the first pixel and the third light emitting area included in the second pixel may emit light of a same color as each other. The third light emitting area included in the first pixel and the first light emitting area included in the second pixel may emit light of the same color as each other.

In an embodiment, the first light emitting area included in the first pixel and the second light emitting area included in the second pixel may emit green light. The second light emitting area included in the first pixel and the third light emitting area included in the second pixel may emit red light. The third light emitting area included in the first pixel and the first light emitting area included in the second pixel may emit blue light.

In an embodiment, each of the first pixel and the second pixel may further include a first pixel electrode disposed in the first light emitting area, a second pixel electrode disposed in the second light emitting area, and a third pixel electrode disposed in the third light emitting area.

In an embodiment, the display device may further include a first active pattern connected to the first pixel electrode, a second active pattern connected to the second pixel electrode, and a third active pattern connected to the third pixel electrode.

In an embodiment, the display device may further include a first data line, a second data line and a third data line. The first data line may be disposed on the substrate and connected to the second active pattern included in the first pixel and the third active pattern included in the second pixel. The second data line may be disposed on the substrate and connected to the first active pattern included in the first pixel and the second active pattern included in the second pixel. The third data line may be disposed on the substrate and connected to the third active pattern included in the first pixel and the first active pattern included in the second pixel.

In an embodiment, the second pixel may be disposed adjacent to the first pixel in a third direction. Each of the first data line, the second data line and the third data line may extend in the third direction. The second data line may be disposed adjacent to the first data line in a fourth direction crossing the third direction. The third data line may be adjacent to the second data line in the fourth direction.

In an embodiment, the second pixel may be disposed adjacent to the first pixel in a third direction. Each of the first data line, the second data line and the third data line may extend in the third direction. The third data line may be disposed adjacent to the first data line in a fourth direction crossing the third direction. The second data line may be disposed adjacent to the third data line in the fourth direction.

In an embodiment, each of the first active pattern, the second active pattern and the third active pattern may include an oxide semiconductor.

In an embodiment, the display device may further include a first light emitting diode, a second light emitting diode and a third light emitting diode. The first light emitting diode may be disposed in each of the first light emitting area included in the first pixel and the second light emitting area included in the second pixel. The second light emitting diode may be disposed in each of the second light emitting area included in the first pixel and the third light emitting area included in the second pixel. The third light emitting diode may be disposed in each of the third light emitting area included in the first pixel and the first light emitting area included in the second pixel.

In an embodiment, the first light emitting diode, the second light emitting diode and the third light emitting diode may emit light of a same color as each other.

In an embodiment, the first light emitting diode, the second light emitting diode and the third light emitting diode may emit light of different colors.

In an embodiment, the display device may further include a first color conversion layer disposed on the first light emitting diode, a second color conversion layer disposed on the second light emitting diode, and a transmission layer disposed on the third light emitting diode.

In an embodiment, the display device may further include a first color filter disposed on the first color conversion layer, a second color filter disposed on the second color conversion layer, and a third color filter disposed on the transmission layer.

In an embodiment, the first light emitting area included in the first pixel and the third light emitting area included in the second pixel may emit light of a same color as each other. The second light emitting area included in the first pixel and the first light emitting area included in the second pixel may emit light of the same color. The third light emitting area included in the first pixel and the second light emitting area included in the second pixel may emit light of the same color as each other.

In an embodiment, the first light emitting area included in the first pixel and the third light emitting area included in the second pixel may emit green light. The second light emitting area included in the first pixel and the first light emitting area included in the second pixel may emit red light. The third light emitting area included in the first pixel and the second light emitting area included in the second pixel may emit blue light.

In an embodiment, each of the first pixel and the second pixel may further include a first pixel electrode disposed in the first light emitting area, a second pixel electrode disposed in the second light emitting area, a third pixel electrode disposed in the third light emitting area, a first active pattern connected to the first pixel electrode, a second active pattern connected to the second pixel electrode, and a third active pattern connected to the third pixel electrode.

In an embodiment, the display device may further include a first data line, a second data line and a third data line. The first data line may be disposed on the substrate, and connected to the second active pattern included in the first pixel and the first active pattern included in the second pixel. The second data line may be disposed on the substrate, and connected to the first active pattern included in the first pixel and the third active pattern included in the second pixel. The third data line may be disposed on the substrate, and connected to the third active pattern included in the first pixel and the second active pattern included in the second pixel.

In an embodiment, each of the first light emitting area, the second light emitting area and the third light emitting area may have a polygonal shape.

In an embodiment, each of the first light emitting area, the second light emitting area and the third light emitting area may have a circular shape.

A display device according to embodiments of the present disclosure may include a plurality of pixels and each of the pixels may include first, second and third light emitting areas. As the first light emitting area included in each of the adjacent pixels emits light of different colors from each other, the second light emitting area included in each of the adjacent pixels emits light of different colors from each other, and the third light emitting area included in each of the adjacent pixels emits light of different colors from each other, a color tinting phenomenon occurring at a boundary of an image displayed in a display area of the display device may be improved. Accordingly, display quality of the display device may be improved.

BRIEF DESCRIPTION OF THE DRAWINGS

FIG. 1 is a block diagram illustrating a display device according to an embodiment.

FIGS. 9 and 10 are cross-sectional views taken along line I-I' of FIG. 3.

FIG. 13 is a cross-sectional view taken along line II-II' of FIG. 3.

FIG. 16 is a cross-sectional view taken along line of FIG. 3.

FIGS. 17, 18, 19, 20 and 21 are plan views for illustrating a display device according to another embodiment.

DETAILED DESCRIPTION OF THE EMBODIMENTS

Figure 2:
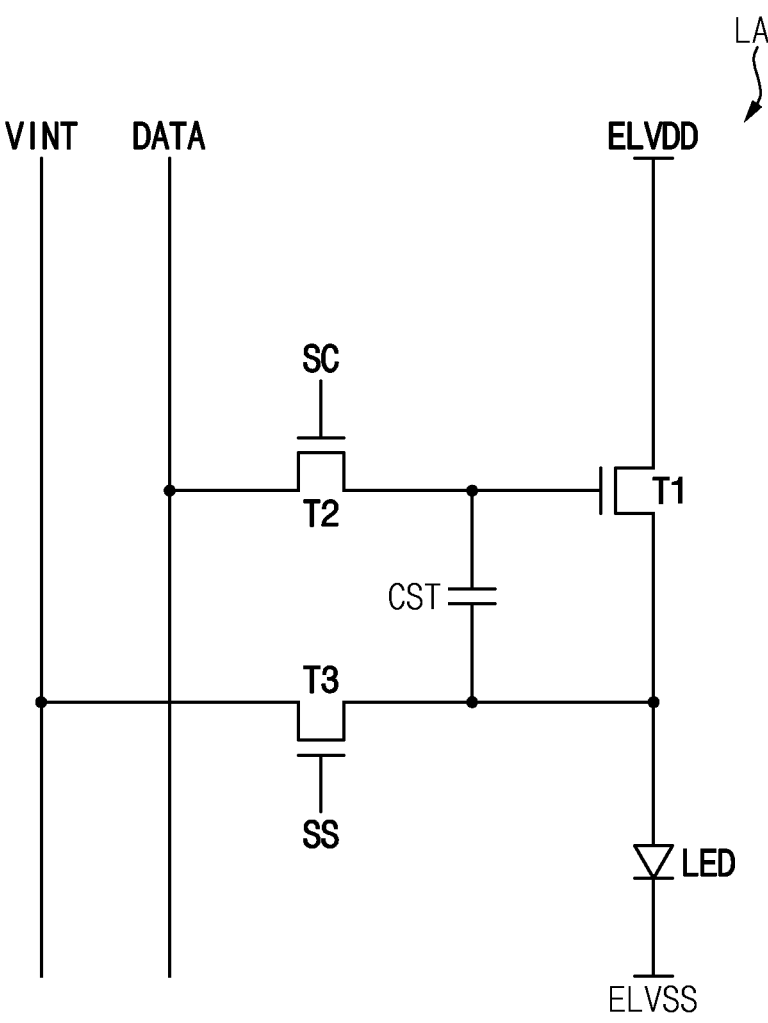
FIG. 2 is an equivalent circuit diagram disposed in a light emitting area included in the display device of FIG. 1.

Hereinafter, display devices in accordance with embodiments will be described in more detail with reference to the accompanying drawings. The same reference numerals are used for the same components in the drawings, and redundant descriptions of the same components will be omitted.

Figure 1:
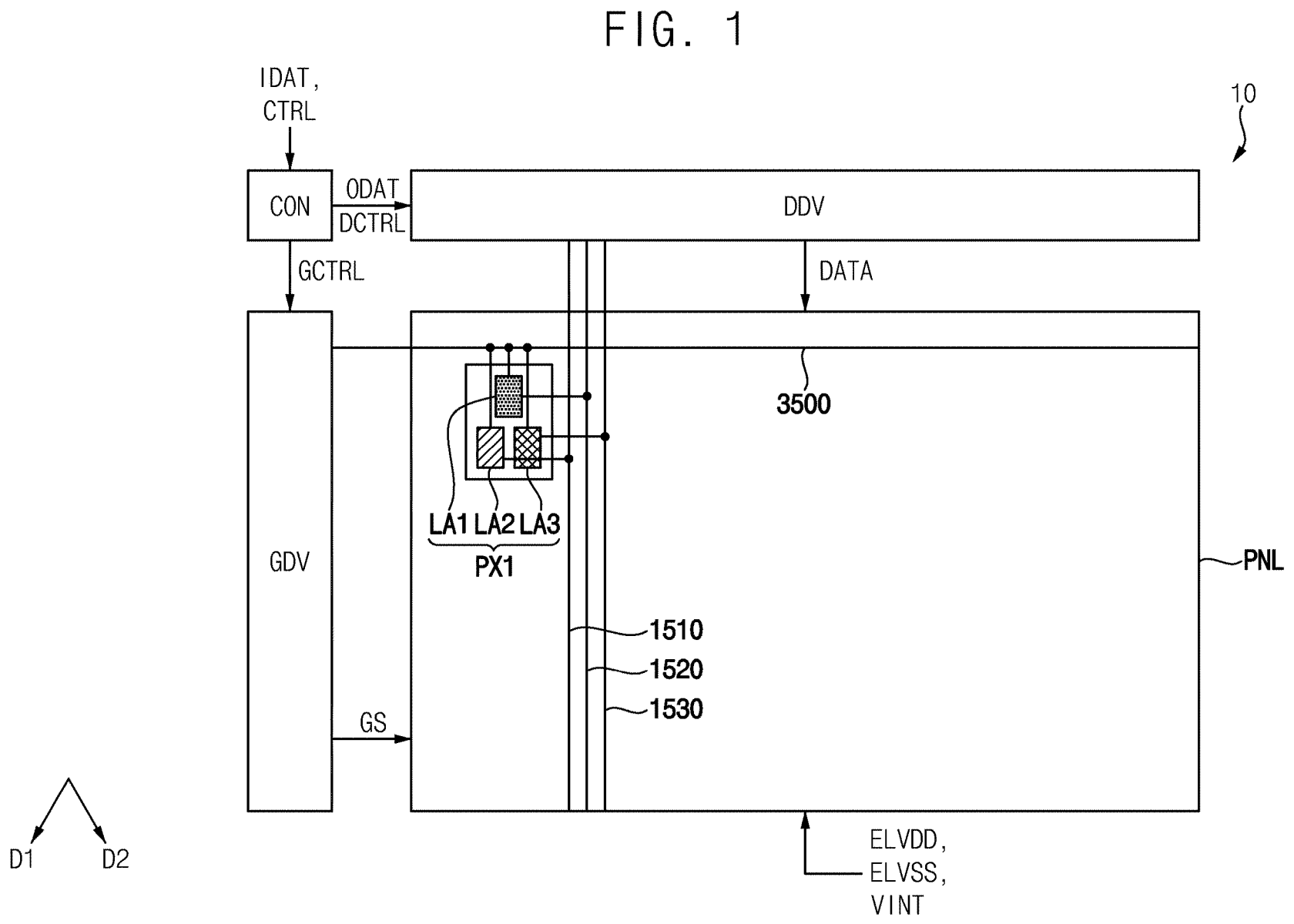

FIG. 1 is a block diagram illustrating a display device according to an embodiment.

Referring to FIG. 1, a display device 10 according to an embodiment of the present disclosure may include a display panel PNL, a data driver DDV, a gate driver GDV and a controller CON.

The display panel PNL may include a plurality of pixels. Each of the pixels may include a plurality of light emitting areas. For example, each of the pixels may include a first light emitting area LA1, a second light emitting area LA2 and a third light emitting area LA3. Each of the first, second and third light emitting areas LA1, LA2 and LA3 may be an area through which light emitted from a light emitting diode is emitted to the outside of the display device 10. Each of the first, second and third light emitting areas LA1, LA2 and LA3 may receive a data voltage DATA, a gate signal GS, a driving voltage ELVDD, a common voltage ELVSS and an initialization voltage VINT. For example, each of the first, second and third light emitting areas LA1, LA2 and LA3 may receive a different data voltage DATA from each other.

In an embodiment, each of the first, second and third light emitting areas LA1, LA2 and LA3 may receive the data voltage DATA through first, second and third data lines 1510, 1520 and 1530, and may receive the gate signal GS through a gate line 3500.

The data driver DDV may generate the data voltage DATA based on an output image data ODAT and a data control signal DCTRL received from the controller CON. For example, the data driver DDV may generate the data voltage DATA corresponding to the output image data ODAT and may output the data voltage DATA in response to the data control signal DCTRL. The data control signal DCTRL may include an output data enable signal, a horizontal start signal, and a load signal. In an embodiment, the data driver DDV may be mounted on the display panel PNL or may be integrated in a periphery portion of the display panel PNL. In another embodiment, the data driver DDV may include one or more integrated circuits (ICs).

The gate driver GDV may generate the gate signal GS based on a gate control signal GCTRL. The gate signal GS may include a first scan signal SC and a second scan signal SS. For example, each of the first scan signal SC and the second scan signal SS may include a gate-on voltage for turning on a transistor and a gate-off voltage for turning off the transistor. The gate control signal GCTRL may include a vertical start signal and a clock signal. In an embodiment, the gate driver GDV may be mounted on the display panel PNL or may be integrated into a peripheral portion of the display panel PNL. In another embodiment, the gate driver GDV may include one or more integrated circuits.

The controller CON (e.g., a timing controller T-CON) may receive an input image data IDAT and a control signal CTRL from an external host processor (e.g., GPU). For example, the input image data IDAT may be RGB data including red image data, green image data and blue image data. The control signal CTRL may include a vertical sync signal, a horizontal sync signal, an input data enable signal, a master clock signal, and the like. The controller CON may generate the gate control signal GCTRL, the data control signal DCTRL and the output image data ODAT based on the input image data IDAT and the control signal CTRL.

FIG. 2 is an equivalent circuit diagram disposed in a light emitting area included in the display device of FIG. 1.

Referring to FIG. 2, the first light emitting area LA1 may include a first transistor T1, a second transistor T2, a third transistor T3, a storage capacitor CST and a light emitting diode LED. The second light emitting area LA2 and the third light emitting area LA3 may have substantially the same circuit structure as the first light emitting area LAL The first transistor T1 may include a first terminal, a second terminal and a gate terminal. The first terminal may receive the driving voltage ELVDD. The second terminal may be connected to the light emitting diode LED. The gate terminal may be connected to the second transistor T2. The first transistor T1 may generate a driving current based on the driving voltage ELVDD and the data voltage DATA.

The second transistor T2 may include a first terminal, a second terminal and a gate terminal. The first terminal may receive the data voltage DATA. The second terminal may be connected to the first transistor T1. The gate terminal may receive the first scan signal SC. The second transistor T2 may transmit the data voltage DATA to the gate terminal of the first transistor T1 in response to the first scan signal SC.

The third transistor T3 may include a first terminal, a second terminal and a gate terminal. The first terminal may be connected to the first transistor T1. The second terminal may receive the initialization voltage VINT. The gate terminal may receive the second scan signal SS. The third transistor T3 may transmit the initialization voltage VINT to the second terminal of the first transistor T1 which is connected to the light emitting diode LED in response to the second scan signal SS.

The storage capacitor CST may include a first terminal and a second terminal. The first terminal may be connected to the gate terminal of the first transistor T1. The second terminal may be connected to the first terminal of the third transistor T3. The storage capacitor CST may maintain a voltage level of the gate terminal of the first transistor T1 during an inactive period of the first scan signal SC.

The light emitting diode LED may include a first terminal and a second terminal. The first terminal may be connected to the second terminal of the first transistor T1. The second terminal may receive the common voltage ELVSS. The light emitting diode LED may emit light having luminance corresponding to the driving current. The light emitting diode LED may include an organic light emitting diode using an organic material as a light emitting layer, an inorganic light emitting diode using an inorganic material as a light emitting layer, and the like.

Figure 3:
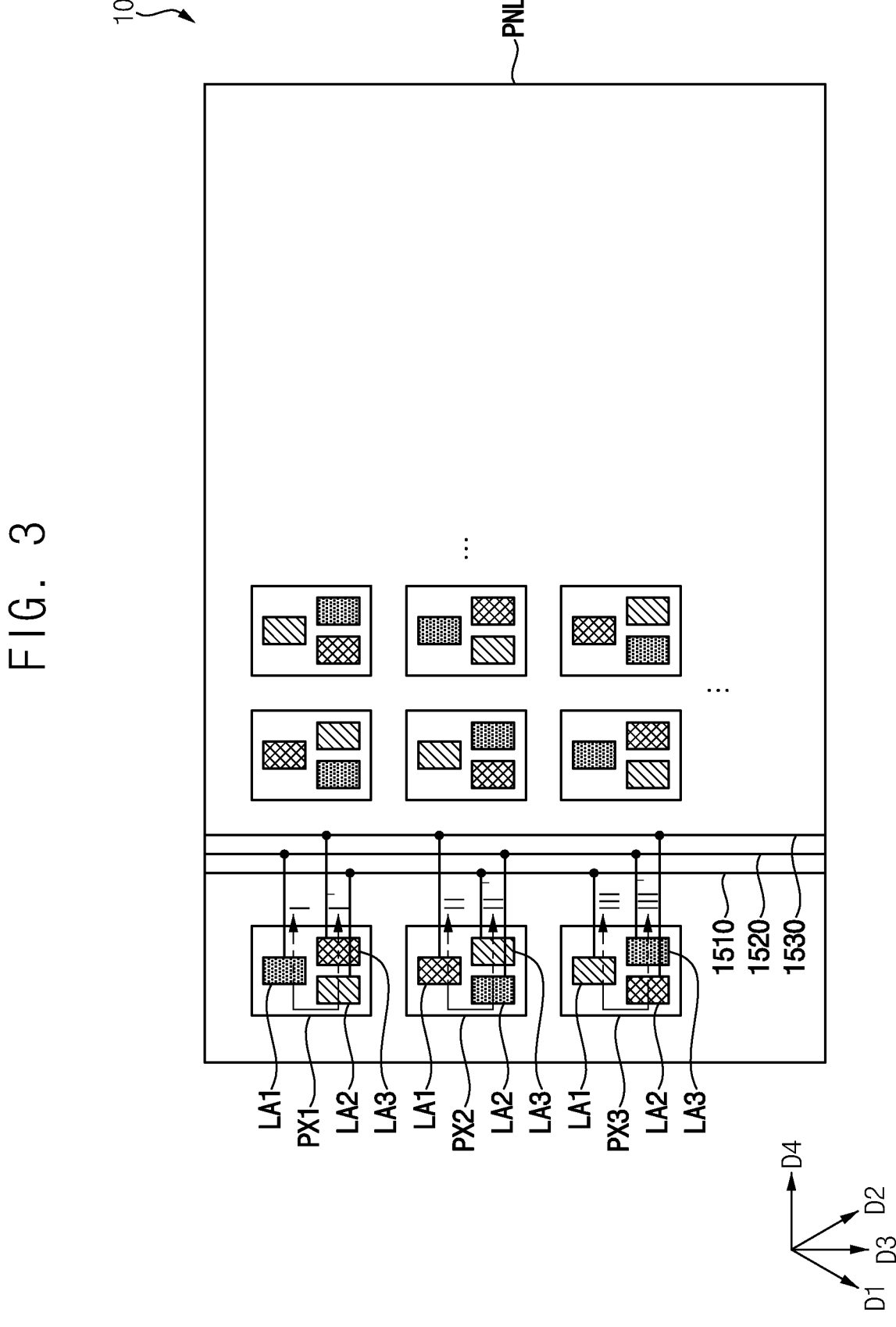
FIG. 3 is a plan view illustrating a display device according to an embodiment.

FIG. 3 is a plan view illustrating a display device according to an embodiment.

Referring to FIG. 3, the display panel PNL may include a first pixel PX1, a second pixel PX2 and a third pixel PX3 disposed in a third direction D3 and a fourth direction D4. Each of the first, second and third pixels PX1, PX2 and PX3 may include the first, second and third light emitting areas LA1, LA2 and LA3.

The first, second and third pixels PX1, PX2 and PX3 may be repeatedly arranged along a row direction and a column direction. Specifically, a set of the first, second and third pixels PX1, PX2 and PX3 may be repeatedly arranged along a third direction D3 and a fourth direction D4 crossing the third direction D3. For example, the second pixel PX2 may be disposed adjacent to the first pixel PX1 in the third direction D3, the third pixel PX3 may be disposed adjacent to the second pixel PX2 in the third direction D3, and a pixel having a same configuration as the first pixel PX1 may be disposed adjacent to the third pixel PX3 in the third direction D3 but is not limited thereto. For example, a pixel having a same configuration as the second pixel PX2 may be disposed adjacent to the first pixel PX1 in the fourth direction D4, a pixel having a same configuration as the third pixel PX3 may be disposed adjacent to the pixel having the same configuration as the second pixel PX2 in the fourth direction D4, and a pixel having a same configuration as the first pixel PX1 may be disposed adjacent to the pixel having the same configuration as the third pixel PX3 in the fourth direction D4.

In an embodiment, the second light emitting area LA2 may be disposed adjacent to the first light emitting area LA1 in a first direction D1, and the third light emitting area LA3 may be disposed adjacent to the first light emitting area LA1 in a second direction D2 crossing the first direction D1 in each of the pixels. For example, a connecting line connecting centers of the first, second and third light emitting areas LA1, LA2 and LA3 in one pixel may form a triangular shape. However, the present disclosure is not limited thereto. In an embodiment, the first light emitting area LA1 is disposed in a first row of each pixel and the second light emitting area LA2 and the third light emitting area LA3 are disposed in a second row of the each pixel.

In an embodiment, the first light emitting area LA1 included in the first pixel PX1, the first light emitting area LA1 included in the second pixel PX2, and the first light emitting area LA1 included in the third pixel PX3 may emit light of different colors. The second light emitting area LA2 included in the first pixel PX1, the second light emitting area LA2 included in the second pixel PX2, and the second light emitting area LA2 included in the third pixel PX3 may emit light of different colors. The third light emitting area LA3 included in the first pixel PX1, the third light emitting area LA3 included in the second pixel PX2, and the third light emitting area LA3 included in the third pixel PX3 may emit light of different colors.

In an embodiment, the second light emitting area LA2 included in the first pixel PX1, the third light emitting area LA3 included in the second pixel PX2, and the first light emitting area LA1 included in the third pixel PX3 may receive a data voltage (e.g., the data voltage DATA of FIG. 1) through the first data line 1510. For example, the second light emitting area LA2 included in the first pixel PX1, the third light emitting area LA3 included in the second pixel PX2, and the first light emitting area LA1 included in the third pixel PX3 may receive a first data voltage. Accordingly, the second light emitting area LA2 included in the first pixel PX1, the third light emitting area LA3 included in the second pixel PX2, and the first light emitting area LA1 included in the third pixel PX3 may emit light of a same color as each other. For example, the second light emitting area LA2 included in the first pixel PX1, the third light emitting area LA3 included in the second pixel PX2, and the first light emitting area LA1 included in the third pixel PX3 may emit red light, but is not limited thereto.

In an embodiment, the first light emitting area LA1 included in the first pixel PX1, the second light emitting area LA2 included in the second pixel PX2, and the third light emitting area LA3 included in the third pixel PX3 may receive a second data voltage through the second data line 1520. Accordingly, the first light emitting area LA1 included in the first pixel PX1, the second light emitting area LA2 included in the second pixel PX2, and the third light emitting area LA3 included in the third pixel PX3 may emit light of a same color as each other. For example, the first light emitting area LA1 included in the first pixel PX1, the second light emitting area LA2 included in the second pixel PX2, and the third light emitting area LA3 included in the third pixel PX3 may emit green light, but is not limited thereto.

In an embodiment, the third light emitting area LA3 included in the first pixel PX1, the first light emitting area LA1 included in the second pixel PX2, and the second light emitting area LA2 included in the third pixel PX3 may receive a third data voltage through the third data line 1530. Accordingly, the third light emitting area LA3 included in the first pixel PX1, the first light emitting area LA1 included in the second pixel PX2, and the second light emitting area LA2 included in the third pixel PX3 may emit light of a same color as each other. For example, the third light emitting area LA3 included in the first pixel PX1, the first light emitting area LA1 included in the second pixel PX2, and the second light emitting area LA2 included in the third pixel PX3 may emit blue light, but is not limited thereto.

Each of the first, second and third light emitting areas LA1, LA2 and LA3 may have various shapes. In an embodiment, each of the first, second and third light emitting areas LA1, LA2 and LA3 may have a polygonal shape. For example, each of the first, second and third light emitting areas LA1, LA2 and LA3 may have a quadrangular planar shape. Areas of each of the first, second and third light emitting areas LA1, LA2 and LA3 may be different from each other. However, the present disclosure is not limited thereto.

FIGS. 4, 5, 6, 7 and 8 are layout views for illustrating an example of pixels included in the display device of FIG. 1. For example, FIGS. 4, 5, 6, 7 and 8 may be views for illustrating a plurality of conductive patterns included in the first pixel PX1.

Figure 4:
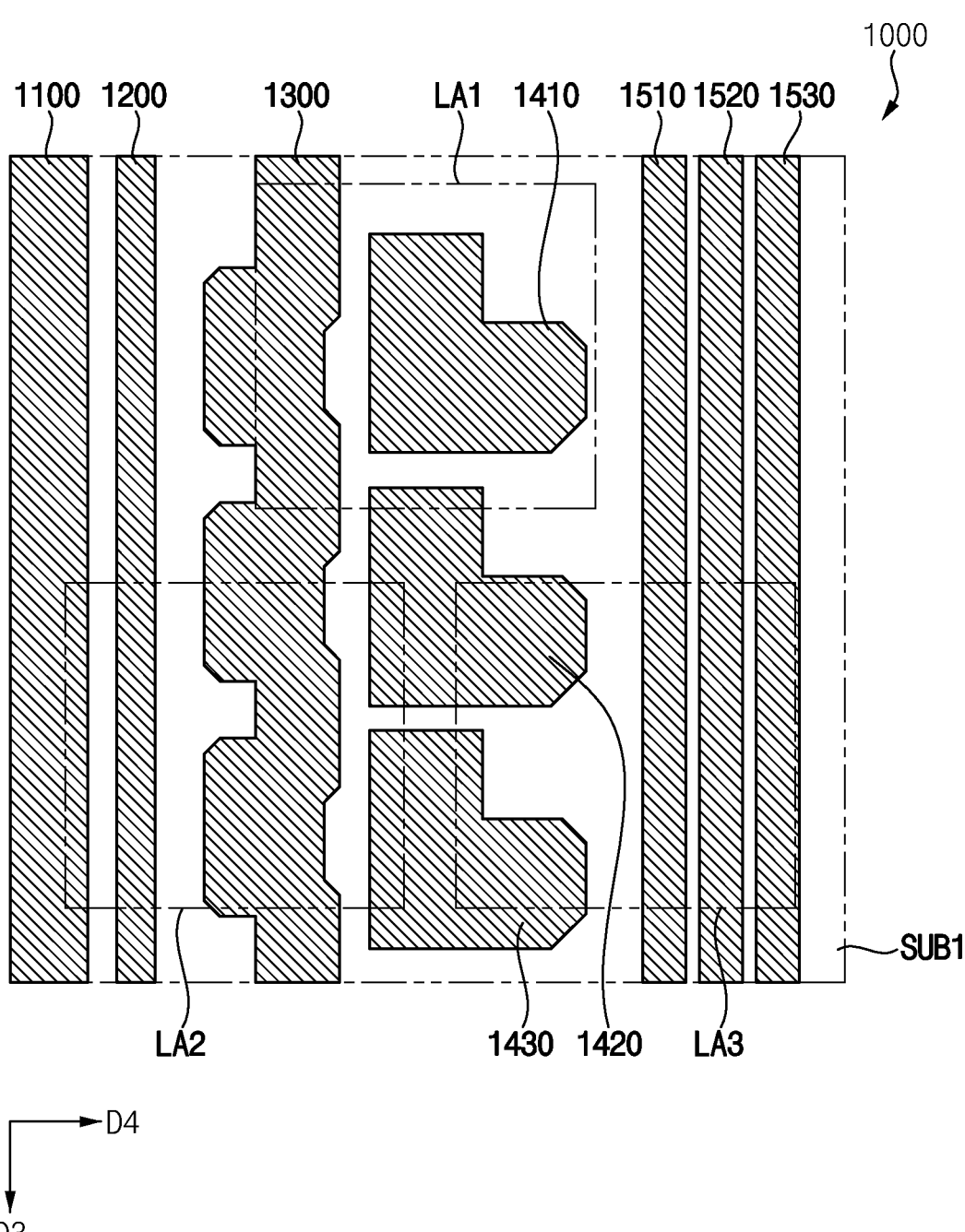
FIGS. 4, 5, 6, 7 and 8 are layout views for illustrating an example of pixels included in the display device of FIG. 1.

Referring to FIG. 4, the first pixel PX1 may include a first substrate SUB1 and a first conductive pattern 1000. The first conductive pattern 1000 may be disposed on the first substrate SUB1. The first conductive pattern 1000 may include a common voltage line 1100, an initialization voltage line 1200, a driving voltage line 1300, a first capacitor electrode pattern 1410, a second capacitor electrode pattern 1420, a third capacitor electrode pattern 1430, a first data line 1510, a second data line 1520, and a third data line 1530.

The first substrate SUB1 may include a transparent or opaque material. In an embodiment, examples of materials that can be used as the first substrate SUB1 may include glass, quartz, plastic, and the like. These may be used alone or in combination with each other.

The common voltage line 1100 may be disposed on the first substrate SUB1 and may extend in the third direction D3. The common voltage line 1100 may provide the common voltage ELVSS to the first, second and third light emitting areas LA1, LA2 and LA3.

The initialization voltage line 1200 may be disposed on the first substrate SUB1 and may extend in the third direction D3. The initialization voltage line 1200 may be disposed adjacent to the common voltage line 1100 in the fourth direction D4, and may provide the initialization voltage VINT to the first, second and third light emitting areas LA1, LA2 and LA3.

The driving voltage line 1300 may be disposed on the first substrate SUB1 and may extend in the third direction D3. The driving voltage line 1300 may be disposed adjacent to the initialization voltage line 1200 in the fourth direction D4, and may provide the driving voltage ELVDD to the first, second and third light emitting areas LA1, LA2 and LA3.

The first capacitor electrode pattern 1410 may be disposed on the first substrate SUB1 and may be disposed adjacent to the driving voltage line 1300 in the fourth direction D4. In an embodiment, the first capacitor electrode pattern 1410 may be electrically connected to the initialization voltage line 1200. For example, the first capacitor electrode pattern 1410 may correspond to the second terminal of the storage capacitor CST included in the first light emitting area LA1 described with reference to FIG. 2.

Also, the second capacitor electrode pattern 1420 may be disposed adjacent to the first capacitor electrode pattern 1410 in the third direction D3 and may be electrically connected to the initialization voltage line 1200. For example, the second capacitor electrode pattern 1420 may correspond to the second terminal of the storage capacitor CST included in the second light emitting area LA2 described with reference to FIG. 2.

The third capacitor electrode pattern 1430 may be disposed adjacent to the second capacitor electrode pattern 1420 in the third direction D3, and may be electrically connected to the initialization voltage line 1200. For example, the third capacitor electrode pattern 1430 may correspond to the second terminal of the storage capacitor CST included in the third light emitting area LA3 described with reference to FIG. 2.

The first data line 1510 may be disposed on the first substrate SUB1 and may extend in the third direction D3. The first data line 1510 may provide the first data voltage to the second light emitting area LA2.

Also, the second data line 1520 may extend in the third direction D3, may be adjacent to the first data line 1510 in the fourth direction D4, and may provide the second data voltage to the first light emitting area LA1. The third data line 1530 may extend in the third direction D3, may be disposed adjacent to the second data line 1520 in the fourth direction D4, and may provide the third data voltage to the third light emitting area LA3.

In an embodiment, the first conductive pattern 1000 may include a conductive material. Examples of the conductive material that can be used as the first conductive pattern 1000 may include silver (Ag), an alloy containing silver, molybdenum (Mo), an alloy containing molybdenum, aluminum (Al), and aluminum, an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other. Also, the first conductive pattern 1000 may include a single layer or multiple layers.

Figure 5:
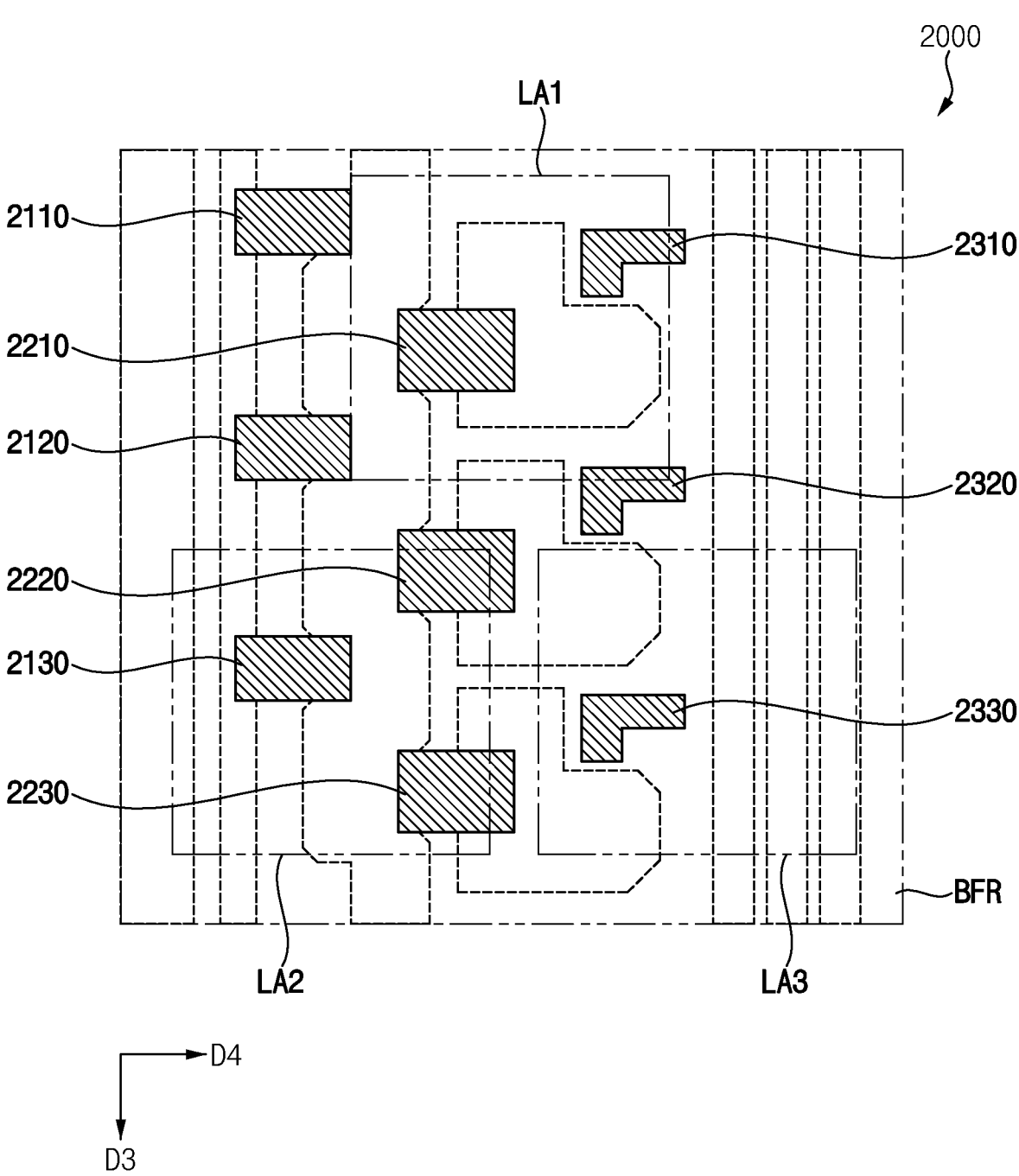

Referring to FIG. 5, a buffer layer BFR may be disposed on the first conductive pattern 1000 and may cover the first conductive pattern 1000. The buffer layer BFR may prevent diffusion of metal atoms or impurities from the first substrate SUB1 into a semiconductor pattern 2000. Also, the buffer layer BFR may control a heat supply rate during a crystallization process for forming the semiconductor pattern 2000.

A semiconductor pattern 2000 may be disposed on the buffer layer BFR. The semiconductor pattern 2000 may include a first semiconductor pattern 2110, a second semiconductor pattern 2120, a third semiconductor pattern 2130, a fourth semiconductor pattern 2210, a fifth semiconductor pattern 2220, a sixth semiconductor pattern 2230, a first active pattern 2310, a second active pattern 2320, and a third active pattern 2330.

The first semiconductor pattern 2110, the second semiconductor pattern 2120 and the third semiconductor pattern 2130 may be arranged along the third direction D3, and may overlap the initialization voltage line 1200.

In an embodiment, the first semiconductor pattern 2110 may be electrically connected to the initialization voltage line 1200, and may transmit the initialization voltage VINT to the first light emitting area LA1. For example, the first semiconductor pattern 2110 may correspond to the first terminal and the second terminal of the third transistor T3 included in the first light emitting area LA1 described with reference to FIG. 2.

Also, the second semiconductor pattern 2120 may be electrically connected to the initialization voltage line 1200, and may transmit the initialization voltage VINT to the second light emitting area LA2. The third semiconductor pattern 2130 may be electrically connected to the initialization voltage line 1200, and may transmit the initialization voltage VINT to the third light emitting area LA3.

The fourth semiconductor pattern 2210, the fifth semiconductor pattern 2220 and the sixth semiconductor pattern 2230 may be arranged along the third direction D3, and may overlap the first capacitor electrode pattern 1410, the second capacitor electrode pattern 1420 and the third capacitor electrode pattern 1430, respectively.

In an embodiment, the fourth semiconductor pattern 2210 may be electrically connected to the driving voltage line 1300, and may transmit the driving voltage ELVDD to the first light emitting area LA1. For example, the fourth semiconductor pattern 2210 may correspond to the first terminal and the second terminal of the first transistor T1 included in the first light emitting area LA1 described with reference to FIG. 2.

Also, the fifth semiconductor pattern 2220 may be electrically connected to the driving voltage line 1300, and may transmit the driving voltage ELVDD to the second light emitting area LA2. The sixth semiconductor pattern 2230 may be electrically connected to the driving voltage line 1300, and may transmit the driving voltage ELVDD to the third light emitting area LA3.

The first active pattern 2310, the second active pattern 2320 and the third active pattern 2330 may be arranged along the third direction D3. In an embodiment, the first active pattern 2310 may be electrically connected to the second data line 1520, and may transmit the second data voltage to the first light emitting area LA1. For example, the first active pattern 2310 may correspond to the first terminal and the second terminal of the second transistor T2 included in the first light emitting area LA1 described with reference to FIG. 2.

Also, the second active pattern 2320 may be electrically connected to the first data line 1510, and may transmit the first data voltage to the second light emitting area LA2. The third active pattern 2330 may be electrically connected to the third data line 1530, and may transmit the third data voltage to the third light emitting area LA3.

In an embodiment, the semiconductor pattern 2000 may include a silicon semiconductor material or an oxide semiconductor material. Examples of the silicon semiconductor material that can be used as the semiconductor pattern 2000 may include amorphous silicon, polycrystalline silicon, and the like. Examples of the oxide semiconductor material that can be used as the semiconductor pattern 2000 may include indium gallium zinc oxide (IGZO), indium tin zinc oxide (ITZO), and the like. These may be used alone or in combination with each other.

Figure 6:
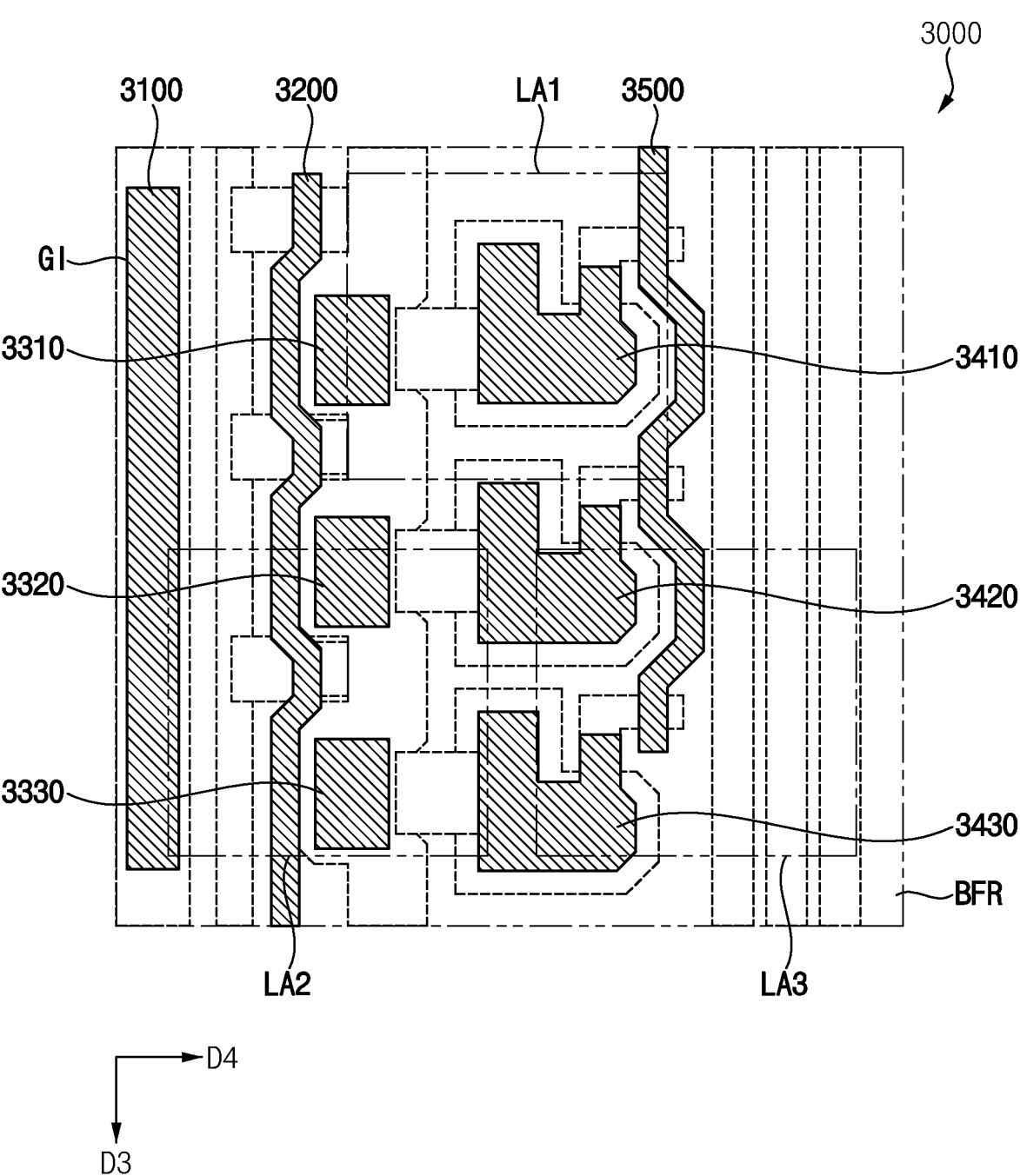

Referring to FIG. 6, a gate insulating layer GI may be disposed on the semiconductor pattern 2000. In an embodiment, the gate insulating layer GI may include an insulating material. Examples of the insulating material that can be used as the gate insulating layer GI may include silicon oxide, silicon nitride, silicon oxynitride, and the like. These may be used alone or in combination with each other.

A second conductive pattern 3000 may be disposed on the gate insulating layer GI. The second conductive pattern 3000 may include a first double pattern 3100, an initialization gate line 3200, a second double pattern 3310, a third double pattern 3320, a fourth double pattern 3330, a first gate electrode 3410, a second gate electrode 3420, a third gate electrode 3430, and a gate line 3500.

The first double pattern 3100 may overlap the common voltage line 1100, and may extend in the third direction D3. The first double pattern 3100 may be electrically connected to the common voltage line 1100. The first double pattern 3100 may reduce electrical resistance of the common voltage line 1100. Accordingly, a voltage drop of the common voltage ELVSS may be prevented.

The initialization gate line 3200 may extend in the third direction D3, and may overlap the first semiconductor pattern 2110, the second semiconductor pattern 2120 and the third semiconductor pattern 2130. The initialization gate line 3200 may provide the second scan signal SS to the first light emitting area LA1, the second light emitting area LA2 and the third light emitting area LA3.

The second double pattern 3310, the third double pattern 3320 and the fourth double pattern 3330 may be arranged along the third direction D3, and may overlap the driving voltage line 1300. The second double pattern 3310, the third double pattern 3320 and the fourth double pattern 3330 may be electrically connected to the driving voltage line 1300, and may reduce electrical resistance of the driving voltage line 1300. Accordingly, a voltage drop of the driving voltage ELVDD may be prevented.

The first gate electrode 3410, the second gate electrode 3420 and the third gate electrode 3430 may be arranged along the third direction D3.

In an embodiment, the first gate electrode 3410 may be electrically connected to the first active pattern 2310, and may overlap the fourth semiconductor pattern 2210. For example, the first gate electrode 3410 may correspond to the gate terminal of the first transistor T1 included in the first light emitting area LA1 described with reference to FIG. 2.

Also, the second gate electrode 3420 may be electrically connected to the second active pattern 2320, and may overlap the fifth semiconductor pattern 2220. The third gate electrode 3430 may be electrically connected to the third active pattern 2330, and may overlap the sixth semiconductor pattern 2230.

In an embodiment, the first gate electrode 3410 may overlap the first capacitor electrode pattern 1410. For example, the first gate electrode 3410 may correspond to the first terminal of the storage capacitor CST included in the first light emitting area LA1 described with reference to FIG. 2.

Also, the second gate electrode 3420 may overlap the second capacitor electrode pattern 1420. The third gate electrode 3430 may overlap the third capacitor electrode pattern 1430.

The gate line 3500 may extend in the third direction D3, and may overlap the first active pattern 2310, the second active pattern 2320 and the third active pattern 2330. The gate line 3500 may provide the first scan signal SC to the first light emitting area LA1, the second light emitting area LA2 and the third light emitting area LA3. For example, the gate line 3500 may correspond to the gate terminal of the second transistor T2 included in the first light emitting area LA1 described with reference to FIG. 2.

The second conductive pattern 3000 may include a conductive material. Examples of the conductive material that can be used as the second conductive pattern 3000 may include silver (Ag), an alloy containing silver, molybdenum (Mo), an alloy containing molybdenum, aluminum (Al), and aluminum, an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other. Also, the second conductive pattern 3000 may be composed of a single layer or multiple layers.

Figure 7:
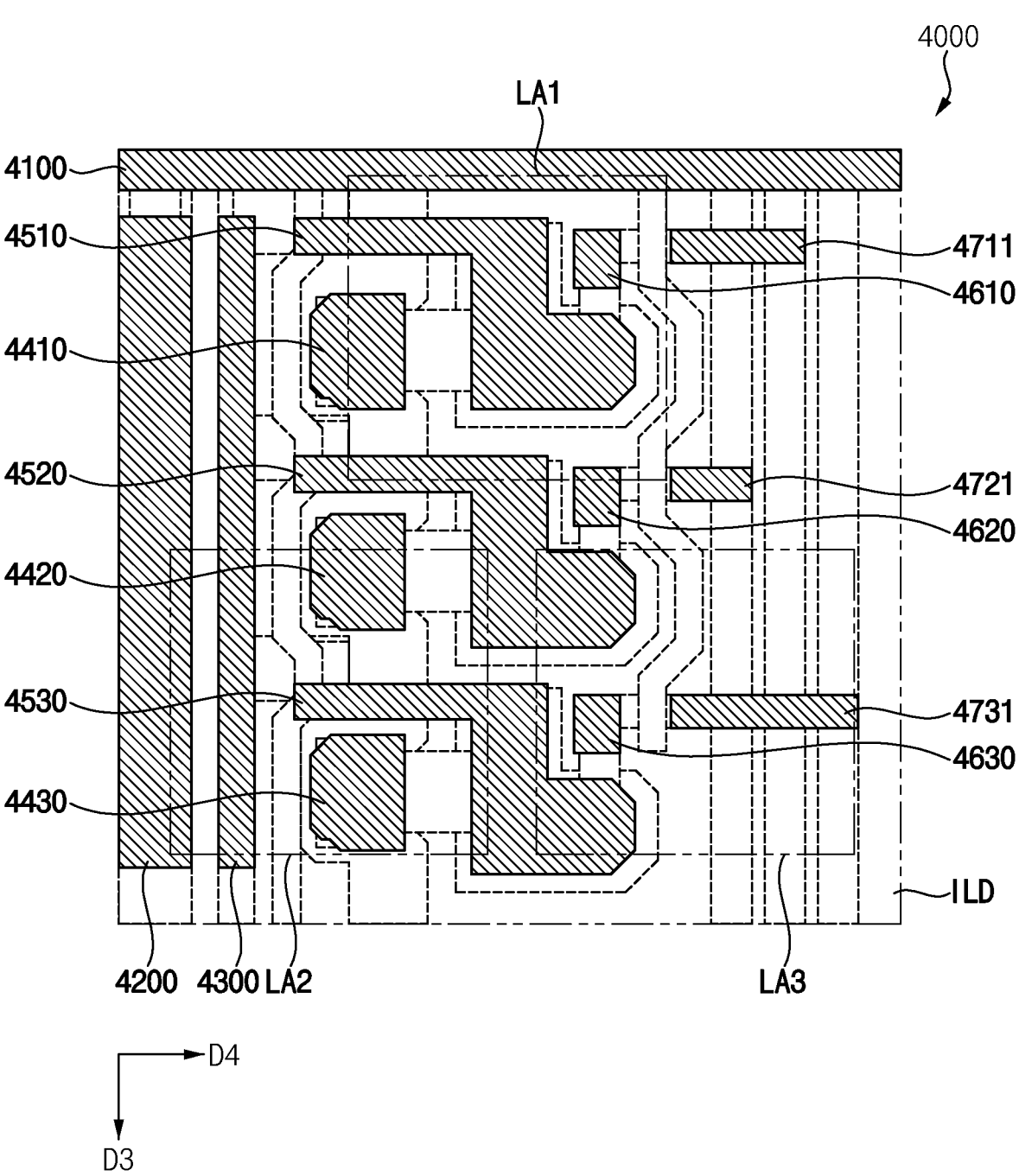

Referring to FIG. 7, an interlayer insulating layer ILD may be disposed on the second conductive pattern 3000, and may cover the second conductive pattern 3000. In an embodiment, the interlayer insulating layer ILD may include an insulating material. Examples of the insulating material that can be used as the interlayer insulating layer ILD may include silicon oxide, silicon nitride, silicon oxynitride, and the like. These may be used alone or in combination with each other. Also, the interlayer insulating layer ILD may include a single layer or multiple layers.

A third conductive pattern 4000 may be disposed on the interlayer insulating layer ILD. The third conductive pattern 4000 may include a gate connection line 4100, a common voltage connection pattern 4200, an initialization voltage connection pattern 4300, a first driving voltage connection pattern 4410, a second driving voltage connection pattern 4420, a third driving voltage connection pattern 4430, a first anode pad 4510, a second anode pad 4520, a third anode pad 4530, a first connection pattern 4610, a second connection pattern 4620, a third connection pattern 4630, a first data pattern 4711, a second data pattern 4721, and a third data pattern 4731.

The gate connection line 4100 may extend in the fourth direction D4. The gate connection line 4100 may contact the gate line 3500 through at least one contact hole. The gate connection line 4100 may transmit the first scan signal SC to the gate line 3500.

The common voltage connection pattern 4200 may overlap the common voltage line 1100 and the first double pattern 3100, and may extend in the third direction D3. The common voltage connection pattern 4200 may contact the common voltage line 1100 and the first double pattern 3100 through at least one contact hole.

The initialization voltage connection pattern 4300 may overlap the initialization voltage line 1200, and may extend in the third direction D3. The initialization voltage connection pattern 4300 may contact the initialization voltage line 1200, the first semiconductor pattern 2110, the second semiconductor pattern 2120 and the third semiconductor pattern 2130 through at least one contact hole. The initialization voltage connection pattern 4300 may transmit the initialization voltage VINT from the initialization voltage line 1200 to the first, second and third semiconductor patterns 2110, 2120 and 2130.

The first driving voltage connection pattern 4410, the second driving voltage connection pattern 4420 and the third driving voltage connection pattern 4430 may be arranged along the third direction D3.

The first driving voltage connection pattern 4410 may contact the driving voltage line 1300, the fourth semiconductor pattern 2210 and the second double pattern 3310 through at least one contact hole. The first driving voltage connection pattern 4410 may transmit the driving voltage ELVDD from the driving voltage line 1300 to the fourth semiconductor pattern 2210.

Also, the second driving voltage connection pattern 4420 may contact the driving voltage line 1300, the fifth semiconductor pattern 2220 and the third double pattern 3320 through at least one contact hole. The third driving voltage connection pattern 4430 may contact the driving voltage line 1300, the sixth semiconductor pattern 2230 and the fourth double pattern 3330 through at least one contact hole.

The first anode pad 4510, the second anode pad 4520 and the third anode pad 4530 may be arranged along the third direction D3.

The first anode pad 4510 may contact the first capacitor electrode pattern 1410, the first semiconductor pattern 2110 and the fourth semiconductor pattern 2210 through at least one contact hole. The first anode pad 4510 may transmit the initialization voltage VINT from the first semiconductor pattern 2110 to the first capacitor electrode pattern 1410.

Also, the second anode pad 4520 may contact the second capacitor electrode pattern 1420, the second semiconductor pattern 2120 and the fifth semiconductor pattern 2220 through at least one contact hole. The third anode pad 4530 may contact the third capacitor electrode pattern 1430, the third semiconductor pattern 2130 and the sixth semiconductor pattern 2230 through at least one contact hole.

The first connection pattern 4610, the second connection pattern 4620 and the third connection pattern 4630 may be arranged along the third direction D3.

In an embodiment, the first connection pattern 4610 may overlap the first active pattern 2310 and the first gate electrode 3410. Also, the first connection pattern 4610 may contact the first active pattern 2310 and the first gate electrode 3410 through at least one contact hole. In other words, the first connection pattern 4610 may connect the first active pattern 2310 and the first gate electrode 3410. Accordingly, the first connection pattern 4610 may transmit the second data voltage from the first active pattern 2310 to the first gate electrode 3410.

In an embodiment, the second connection pattern 4620 may overlap the second active pattern 2320 and the second gate electrode 3420. Also, the second connection pattern 4620 may contact the second active pattern 2320 and the second gate electrode 3420 through at least one contact hole.

In other words, the second connection pattern 4620 may connect the second active pattern 2320 and the second gate electrode 3420. Accordingly, the second connection pattern 4620 may transmit the first data voltage from the second active pattern 2320 to the second gate electrode 3420.

In an embodiment, the third connection pattern 4630 may overlap the third active pattern 2330 and the third gate electrode 3430. Also, the third connection pattern 4630 may contact the third active pattern 2330 and the third gate electrode 3430 through at least one contact hole. In other words, the third connection pattern 4630 may connect the third active pattern 2330 and the third gate electrode 3430. Accordingly, the third connection pattern 4630 may transmit the third data voltage from the third active pattern 2330 to the third gate electrode 3430.

The first data pattern 4711, the second data pattern 4721 and the third data pattern 4731 may be arranged along the third direction D3.

The first data pattern 4711 may contact the second data line 1520 and the first active pattern 2310 through at least one contact hole. The first data pattern 4711 may transmit the second data voltage from the second data line 1520 to the first active pattern 2310. In other words, the first data pattern 4711 may transmit the second data voltage from the second data line 1520 to the first light emitting area LAL The second data pattern 4721 may contact the first data line 1510 and the second active pattern 2320 through at least one contact hole. The second data pattern 4721 may transmit the first data voltage from the first data line 1510 to the second active pattern 2320. In other words, the second data pattern 4721 may transmit the first data voltage from the first data line 1510 to the second light emitting area LA2.

The third data pattern 4731 may contact the third data line 1530 and the third active pattern 2330 through at least one contact hole. The third data pattern 4731 may transmit the third data voltage from the third data line 1530 to the third active pattern 2330. In other words, the third data pattern 4731 may transmit the third data voltage from the third data line 1530 to the third light emitting area LA3.

The third conductive pattern 4000 may include a conductive material. Examples of the conductive material that can be used as the third conductive pattern 4000 may include (Ag), an alloy containing silver, molybdenum (Mo), an alloy containing molybdenum, aluminum (Al), and aluminum, an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other. Also, the third conductive pattern 4000 may include a single layer or multiple layers.

Figure 8:
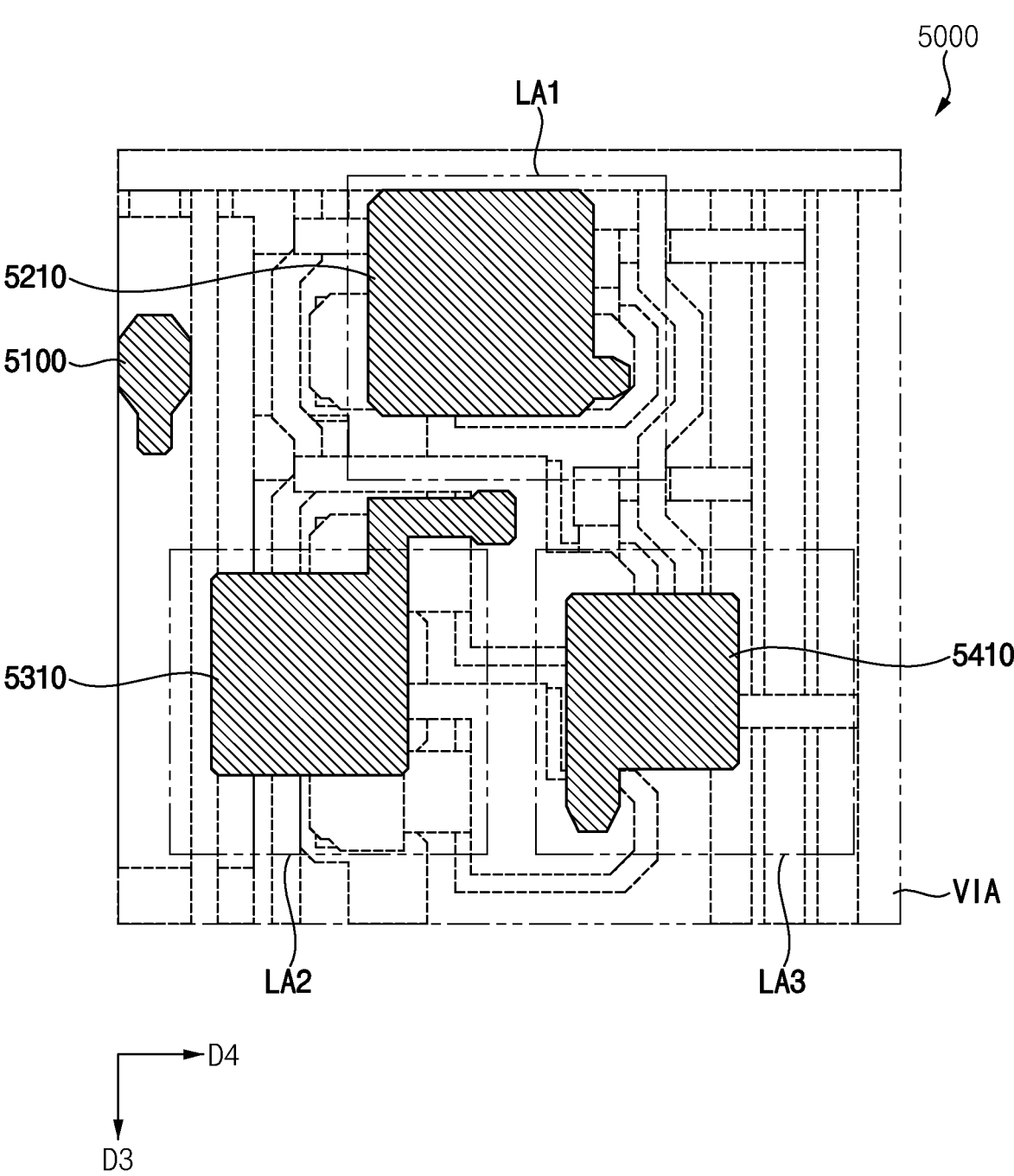

Referring to FIG. 8, a via insulating layer VIA may be disposed on the third conductive pattern 4000, and may cover the third conductive pattern 4000. The via insulating layer VIA may include an insulating material. Examples of the insulating material that can be used as the via insulating layer VIA may include photoresist, polyacrylic resin, polyimide resin, acrylic resin, and the like.

A fourth conductive pattern 5000 may be disposed on the via insulating layer VIA. The fourth conductive pattern 5000 may include a common voltage pattern 5100, a first pixel electrode 5210, a second pixel electrode 5310, and a third pixel electrode 5410.

The common voltage pattern 5100 may overlap the common voltage connection pattern 4200. Also, the common voltage pattern 5100 may contact the common voltage connection pattern 4200 through at least one contact hole. Accordingly, the common voltage ELVSS may be provided to the common voltage pattern 5100.

The first pixel electrode 5210 may contact the first anode pad 4510 through at least one contact hole. The first pixel electrode 5210 may receive the initialization voltage VINT or the driving current through the first anode pad 4510. The driving current may be generated based on the second data voltage transmitted through the first data pattern 4711.

The second pixel electrode 5310 may contact the second anode pad 4520 through at least one contact hole. The second pixel electrode 5310 may receive the initialization voltage VINT or the driving current through the second anode pad 4520. The driving current may be generated based on the first data voltage transmitted through the second data pattern 4721.

The third pixel electrode 5410 may contact the third anode pad 4530 through at least one contact hole. The third pixel electrode 5410 may receive the initialization voltage VINT or the driving current through the third anode pad 4530. The driving current may be generated based on the third data voltage transmitted through the third data pattern 4731.

Figure 9:
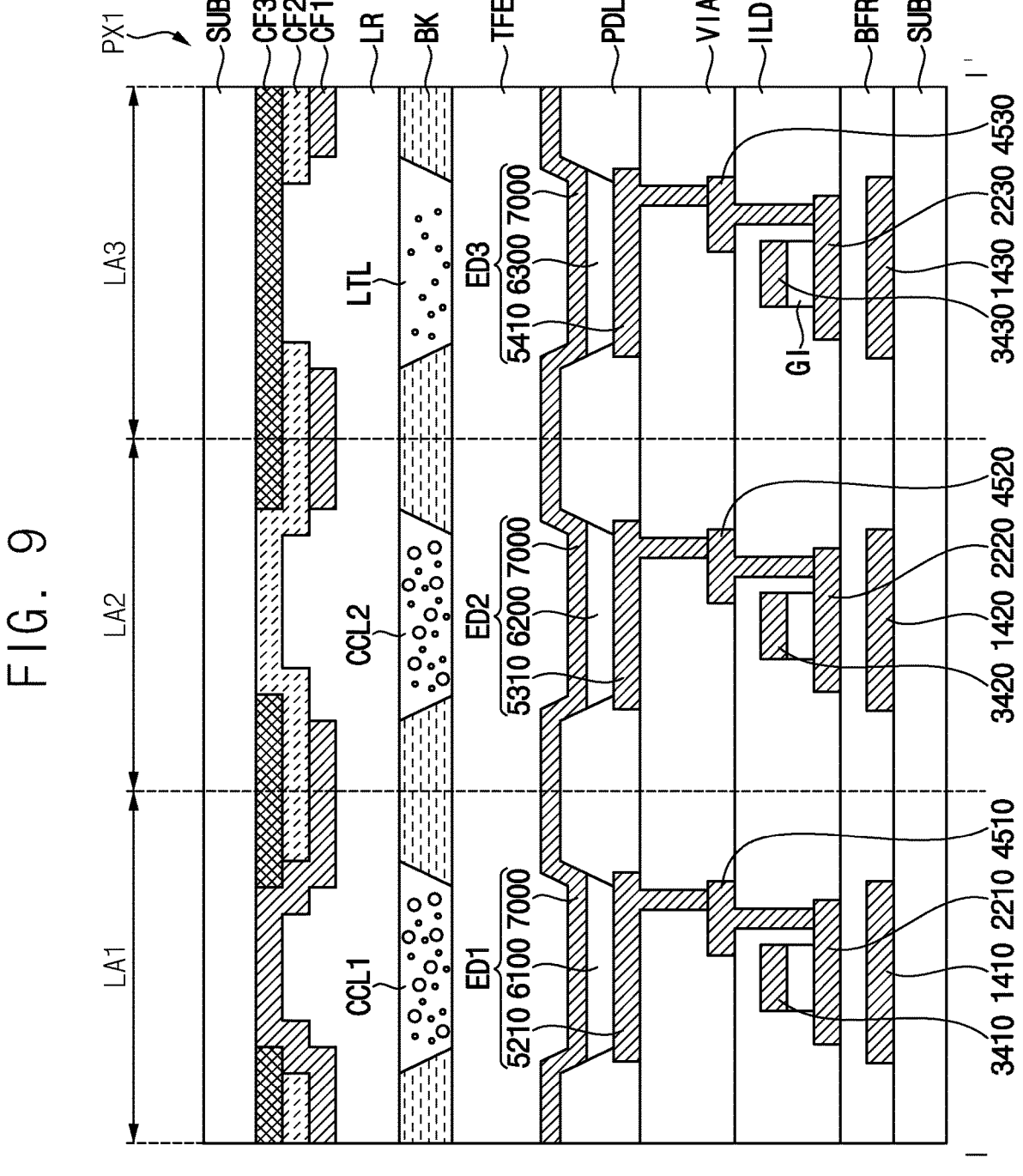
Figure 10:
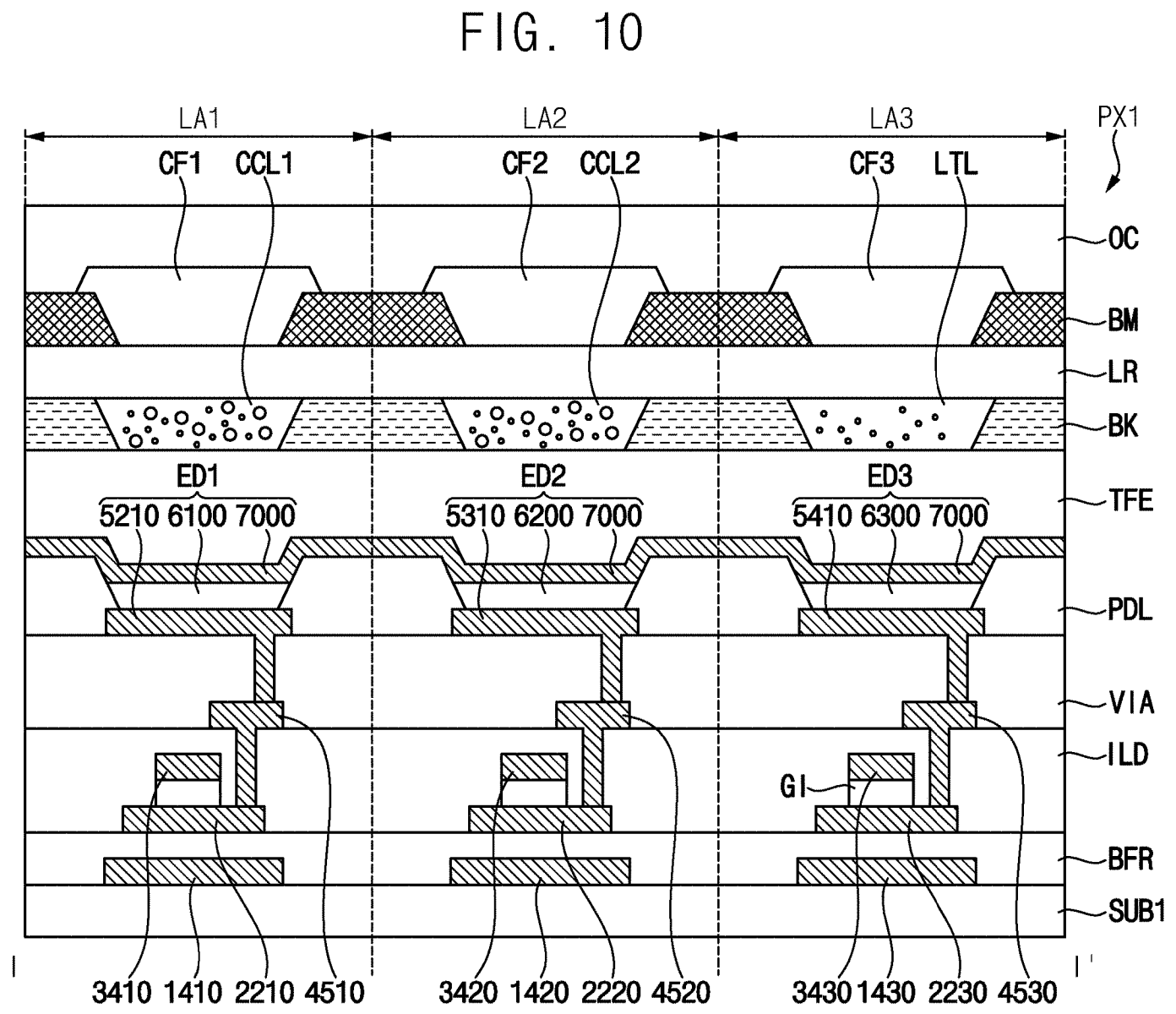

FIGS. 9 and 10 are cross-sectional views taken along line I-I' of FIG. 3.

Referring to FIG. 9, the display device 10 may include the first substrate SUB1, the first, second and third capacitor electrode patterns 1410, 1420 and 1430, the fourth, fifth and sixth semiconductor patterns 2210, 2220 and 2230, the first, second and third gate electrodes 3410, 3420 and 3430, the first, second and third anode pads 4510, 4520 and 4530, the first, second and third pixel electrodes 5210, 5310 and 5410, a first light emitting layer 6100, a second light emitting layer 6200, a third light emitting layer 6300, a common electrode 7000, an encapsulation layer TFE, a bank layer BK, a first color conversion layer CCL1, second color conversion layer CCL2, a transmission layer LTL, a refraction layer LR, a first color filter CF1, a second color filter CF2, a third color filter CF3, and a second substrate SUB2. Hereinafter, redundant descriptions will be omitted.

The pixel defining layer PDL may be disposed on the first, second and third pixel electrodes 5210, 5310 and 5410 and the via insulating layer VIA. The pixel defining layer PDL may include an insulating material. Examples of the insulating material that can be used as the pixel defining layer PDL may include photoresist, polyacrylic resin, polyimide resin, acrylic resin, and the like. These may be used alone or in combination with each other. Openings exposing the first, second and third pixel electrodes 5210, 5310 and 5410 may be formed in the pixel defining layer PDL.

The first light emitting layer 6100 may be disposed on the first pixel electrode 5210. The second light emitting layer 6200 may be disposed on the second pixel electrode 5310. The third light emitting layer 6300 may be disposed on the third pixel electrode 5410. The first light emitting layer 6100, the second light emitting layer 6200 and the third light emitting layer 6300 may be formed of an organic material and may emit light of a predetermined color. Each of the first, second and third light emitting layers 6100, 6200 and 6300 may be entirely formed on the display panel PNL.

In an embodiment, each of the first, second and third light emitting layers 6100, 6200 and 6300 may emit blue light. In another embodiment, the first light emitting layer 6100 may emit green light, the second light emitting layer 6200 may emit red light, and the third light emitting layer 6300 may emit blue light, but is not limited thereto.

In an embodiment, each of the first, second and third light emitting layers 6100, 6200 and 6300 may have a multilayer structure in which a plurality of layers are stacked. For example, when each of the first, second and third light emitting layers 6100, 6200 and 6300 emit blue light, each of the first, second and third light emitting layers 6100, 6200 and 6300 may have a structure in which a plurality of blue organic light emitting layers are stacked.

In another embodiment, each of the first, second and third light emitting layers 6100, 6200 and 6300 may have a multilayer structure in which a plurality of layers emitting light of different colors are stacked. For example, when each of the first, second and third light emitting layers 6100, 6200 and 6300 generates blue light, each of the first, second and third light emitting layers 6100, 6200 and 6300 may have a structure in which a plurality of blue organic light emitting layers and an organic light emitting layer emitting light of a color other than blue (e.g., green) are stacked.

The common electrode 7000 may be disposed on the first, second and third light emitting layers 6100, 6200 and 6300. The common electrode 7000 may be a plate electrode. In an embodiment, the common voltage ELVSS may be provided to the common electrode 7000.

The first pixel electrode 5210, the first light emitting layer 6100 and the common electrode 7000 may constitute a first light emitting diode ED1. For example, the first light emitting diode ED1 may correspond to the light emitting diode LED included in the first light emitting area LA1 described with reference to FIG. 2.

Also, the second pixel electrode 5310, the second light emitting layer 6200 and the common electrode 7000 may constitute a second light emitting diode ED2. The third pixel electrode 5410, the third light emitting layer 6300 and the common electrode 7000 may constitute a third light emitting diode ED3.

In an embodiment, the first light emitting diode ED1, the second light emitting diode ED2 and the third light emitting diode ED3 may emit light having the same color as each other. For example, the first, second and third light emitting diodes ED1, ED2 and ED3 may emit blue light.

In another embodiment, each of the first, second and third light emitting diodes ED1, ED2 and ED3 may emit light of a different color. For example, the first light emitting diode ED1 may emit green light, the second light emitting diode ED2 may emit red light, and the third light emitting diode ED3 may emit blue light, but is not limited thereto.

The encapsulation layer TFE may be disposed on the common electrode 7000. The encapsulation layer TFE may include an insulating material. For example, the encapsulation layer TFE may have a structure in which inorganic layers and organic layers are alternately stacked. The encapsulation layer TFE may prevent foreign substances from penetrating into the first, second and third light emitting layers 6100, 6200 and 6300.

The bank layer BK may be disposed on the encapsulation layer TFE. The bank layer BK may be formed of a light blocking material and may block light emitted from a lower portion. Also, an opening exposing the encapsulation layer TFE may be formed in the bank layer BK.

The first color conversion layer CCL1 may be disposed on the encapsulation layer TFE and may overlap the first light emitting diode ED1. The first color conversion layer CCL1 may include a phosphor, a scattering material, a quantum dot, and the like. In an embodiment, the first color conversion layer CCL1 may convert a wavelength of light emitted from the first light emitting diode ED1. For example, as light emitted from the first light emitting diode ED1 passes through the first color conversion layer CCL1, green light may be emitted from the first light emitting area LA1.

The second color conversion layer CCL2 may be disposed on the encapsulation layer TFE and may overlap the second light emitting diode ED2. The second color conversion layer CCL2 may include a phosphor, a scattering material, a quantum dot, and the like. In an embodiment, the second color conversion layer CCL2 may convert a wavelength of light emitted from the second light emitting diode ED2. For example, as light emitted from the second light emitting diode ED2 passes through the second color conversion layer CCL2, red light may be emitted from the second light emitting area LA2.

The transmission layer LTL may be disposed on the encapsulation layer TFE and may overlap the third light emitting diode ED3. The transmission layer LTL may include a transparent polymer material, a scattering material, and the like. In an embodiment, the transmission layer LTL may scatter a wavelength of light emitted from the third light emitting diode ED3. For example, as light emitted from the third light emitting diode ED3 passes through the transmission layer LTL, blue light may be emitted from the third light emitting area LA3.

In an embodiment, the refraction layer LR may be disposed on the first color conversion layer CCL1, the second color conversion layer CCL2 and the transmission layer LTL. The refraction layer LR may have a predetermined refractive index. Accordingly, light efficiency of the display device 10 may be improved. In another embodiment, the refraction layer LR may be disposed under the first color conversion layer CCL1, the second color conversion layer CCL2 and the transmission layer LTL. In still another embodiment, the refraction layer LR may include first and second refraction layers. The first refraction layer may be disposed on the first color conversion layer CCL1, the second color conversion layer CCL2 and the transmission layer LTL, and the second refraction layer may be disposed under the first color conversion layer CCL1, the second color conversion layer CCL2 and the transmission layer LTL.

The first, second and third color filters CF1, CF2 and CF3 may be disposed on the refraction layer LR. The first, second and third color filters CF1, CF2 and CF3 may selectively transmit light having a specific wavelength.

The first color filter CF1 may partially overlap the first color conversion layer CCL1, the second color filter CF2 may partially overlap the second color conversion layer CCL2, and the third color filter CF3 may partially overlap the transmission layer LTL.

In an embodiment, the first color filter CF1 may transmit green light and block lights having different colors from the green light. The second color filter CF2 may transmit red light and block lights having different colors from the red light. The third color filter CF3 may transmit blue light and block light having different colors from the blue light. However, the present disclosure is not limited thereto.

The second substrate SUB2 may be disposed on the first, second and third color filters CF1, CF2 and CF3. The second substrate SUB2 may include a transparent material or an opaque material. In an embodiment, examples of a material that can be used as the second substrate SUB2 may include glass, quartz, plastic, and the like. These may be used alone or in combination with each other.

Referring to FIG. 10, the display device 10 may include the first substrate SUB1, the first, second and third capacitor electrode patterns 1410, 1420 and 1430, the fourth, fifth and sixth semiconductor patterns 2210, 2220 and 2230, the first, second and third gate electrodes 3410, 3420 and 3430, the first, second and third anode pads 4510, 4520 and 4530, the first, second and third pixel electrodes 5210, 5310 and 5410, the first, second and third light emitting layers 6100, 6200 and 6300, the common electrode 7000, the encapsulation layer TFE, the bank layer BK, the first and second color conversion layers CCL1 and CCL2, the transmission layer LTL, the refraction layer LR, a light blocking layer BM, the first, second and third color filters CF1, CF2 and CF3, and the planarization layer OC. Hereinafter, redundant descriptions will be omitted.

The light blocking layer BM may be disposed on the refraction layer LR. The light blocking layer BM may be formed of a light blocking material and may block light emitted from a lower portion. Also, an opening exposing the refraction layer LR may be formed in the light blocking layer BM.

The first, second and third color filters CF1, CF2 and CF3 may be disposed on the refraction layer LR. The first, second and third color filters CF1, CF2 and CF3 may selectively transmit light having a specific wavelength.

The first color filter CF1 may overlap the first color conversion layer CCL1, the second color filter CF2 may overlap the second color conversion layer CCL2, and the third color filter CF3 may overlap the transmission layer LTL.

In an embodiment, the first color filter CF1 may transmit green light and block lights having different colors from the green light. The second color filter CF2 may transmit red light and block lights having different colors from the red light. The third color filter CF3 may transmit blue light and block light having different colors from the blue light. However, the present disclosure is not limited thereto.

The planarization layer OC may be disposed on the first, second and third color filters CF1, CF2 and CF3. The planarization layer OC may be formed of an organic material and may provide a substantially flat top surface.

Figure 11:
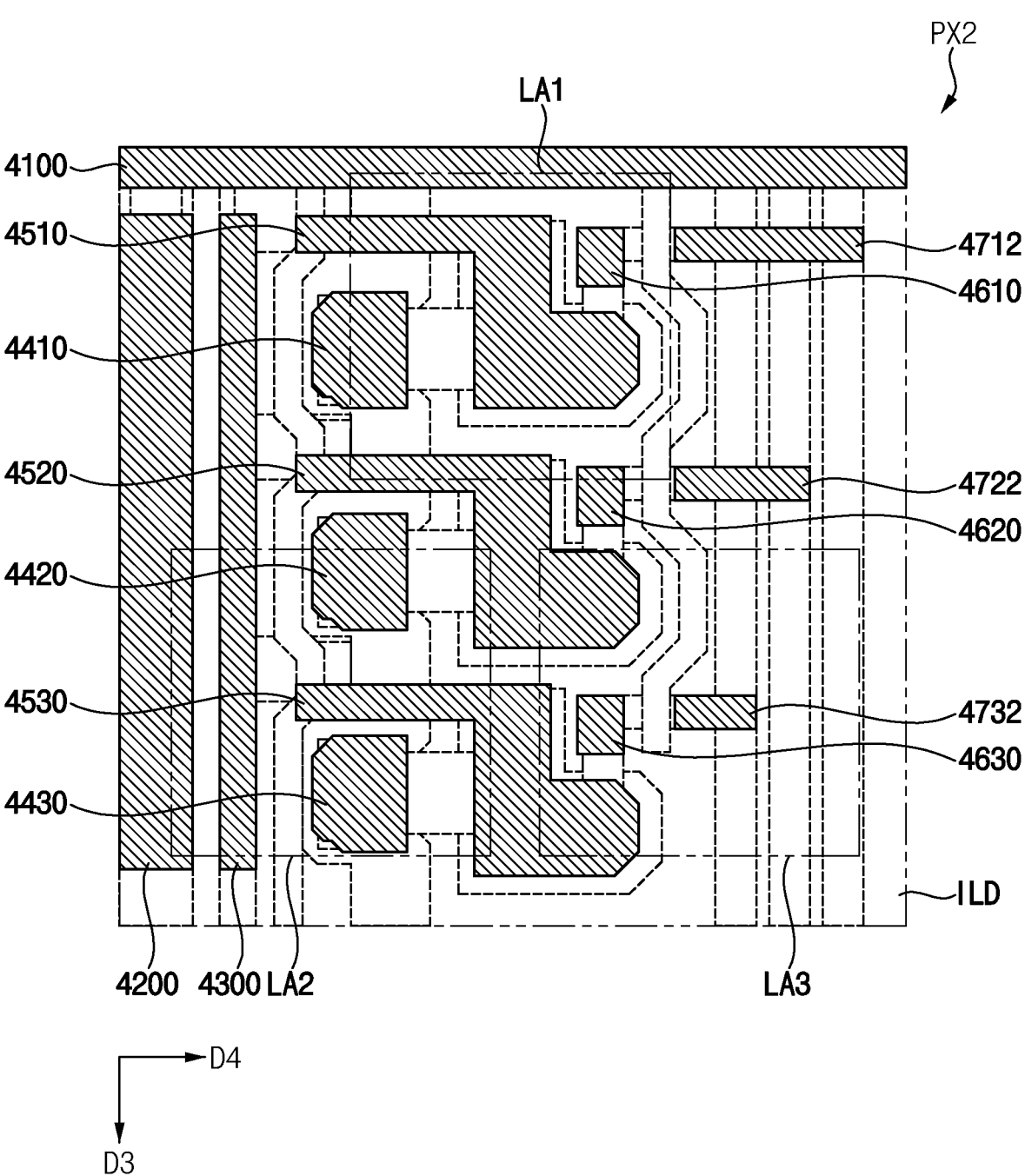
FIG. 11 is a layout view illustrating another example of FIG. 7.
Figure 12:
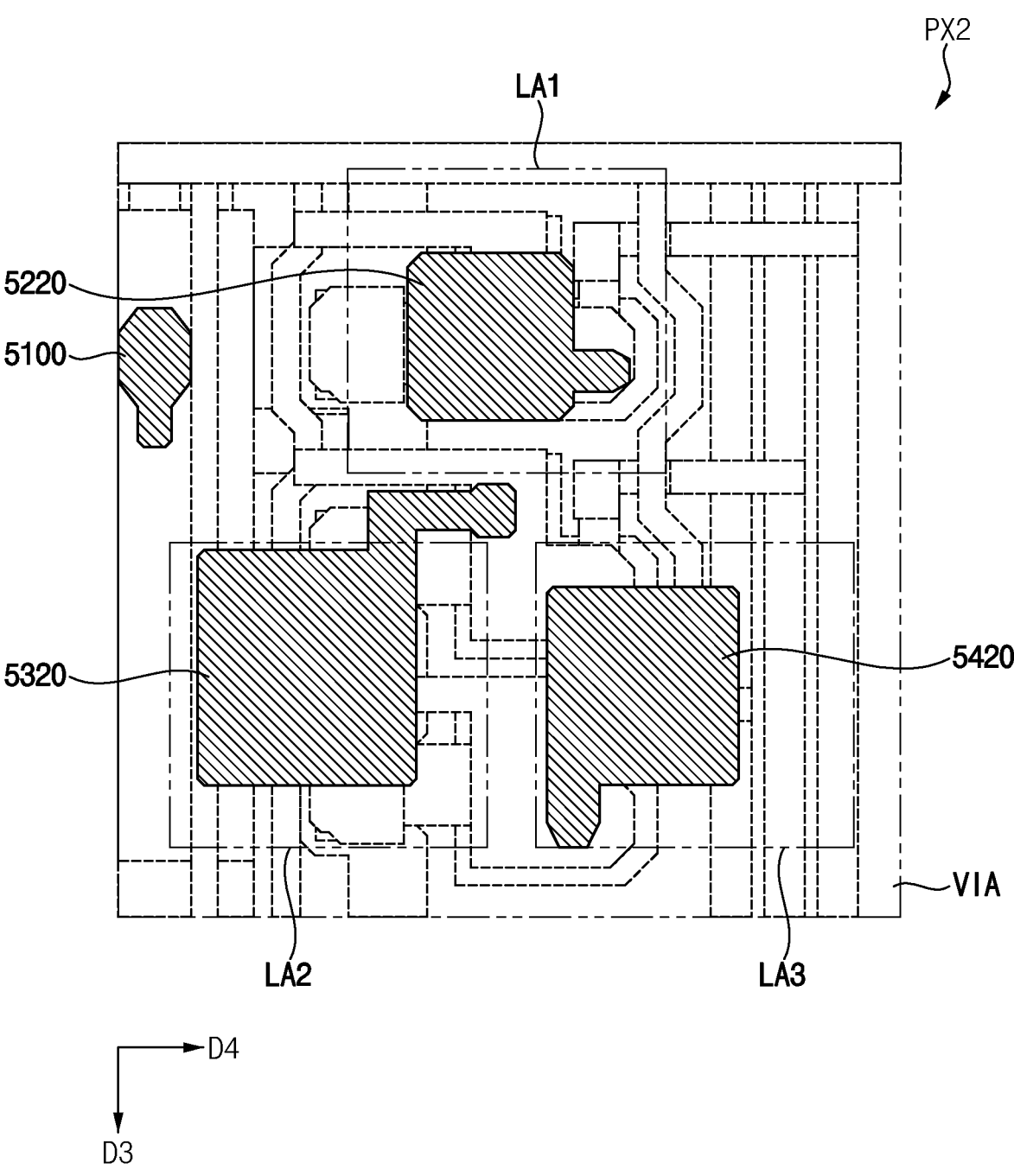
FIG. 12 is a layout view illustrating another example of FIG. 8.

FIG. 11 is a layout view illustrating another example of FIG. 7. FIG. 12 is a layout view illustrating another example of FIG. 8. For example, FIGS. 11 and 12 may be views for illustrating a plurality of conductive patterns included in the second pixel PX2.

Referring to FIGS. 11 and 12, a third conductive pattern 4000 may be disposed on a interlayer insulating layer ILD. The third conductive pattern 4000 may include a gate connection line 4100, a common voltage connection pattern 4200, an initialization voltage connection pattern 4300, a first driving voltage connection pattern 4410, a second driving voltage connection pattern 4420, a third driving voltage connection pattern 4430, a first anode pad 4510, a second anode pad 4520, a third anode pad 4530, a first connection pattern 4610, a second connection pattern 4620, a third connection pattern 4630, a first data pattern 4712, a second data pattern 4722, and a third data pattern 4732.

A via insulating layer VIA may be disposed on the third conductive pattern 4000 and may cover the third conductive pattern 4000. A fourth conductive pattern 5000 may be disposed on the via insulating layer VIA. The fourth conductive pattern 5000 may include a common voltage pattern 5100, a first pixel electrode 5220, a second pixel electrode 5320, and a third pixel electrode 5420.

However, the second pixel PX2 described with reference to FIGS. 11 and 12 may be substantially the same as the first pixel PX1 described with reference to FIGS. 4, 5, 6, 7 and 8 except for the first data pattern 4712, the second data pattern 4722, the third data pattern 4732, the first pixel electrode 5220, the second pixel electrode 5320, and the third pixel electrode 5420.

In an embodiment, in the second pixel PX2, unlike the first pixel PX1, the first light emitting area LA1 may emit blue light, the second light emitting area LA2 may emit green light, and the third light emitting area LA3 may emit red light, but is not limited thereto.

The first data pattern 4712, the second data pattern 4722 and the third data pattern 4732 may be arranged along the third direction D3.

The first data pattern 4712 may contact the third data line 1530 and the first active pattern 2310 through at least one contact hole. The first data pattern 4712 may transmit the third data voltage from the third data line 1530 to the first active pattern 2310. In other words, the first data pattern 4712 may transmit the third data voltage from the third data line 1530 to the first light emitting area LAL The second data pattern 4722 may contact the second data line 1520 and the second active pattern 2320 through at least one contact hole. The second data pattern 4722 may transmit the second data voltage from the second data line 1520 to the second active pattern 2320. In other words, the second data pattern 4722 may transmit the second data voltage from the second data line 1520 to the second light emitting area LA2.

The third data pattern 4732 may contact the first data line 1510 and the third active pattern 2330 through at least one contact hole. The third data pattern 4732 may transmit the first data voltage from the first data line 1510 to the third active pattern 2330. In other words, the third data pattern 4732 may transmit the first data voltage from the first data line 1510 to the third light emitting area LA3.

The first pixel electrode 5220 may contact the first anode pad 4510 through at least one contact hole, and may receive the initialization voltage VINT or the driving current through the first anode pad 4510. The driving current may be generated based on the third data voltage transmitted through the first data pattern 4712.

The second pixel electrode 5320 may contact the second anode pad 4520 through at least one contact hole, and may receive the initialization voltage VINT or the driving current through the second anode pad 4520. The driving current may be generated based on the second data voltage transmitted through the second data pattern 4722.

The third pixel electrode 5420 may contact the third anode pad 4530 through at least one contact hole, and may receive the initialization voltage VINT or the driving current through the third anode pad 4530. The driving current may be generated based on the first data voltage transmitted through the third data pattern 4732.

FIG. 13 is a cross-sectional view taken along line II-IF of FIG. 3.

Referring to FIG. 13, the display device 10 may include a first substrate SUB1, first, second and third capacitor electrode patterns 1410, 1420 and 1430, fourth, fifth and sixth semiconductor patterns 2210, 2220 and 2230, first, second and third gate electrodes 3410, 3420 and 3430, first, second and third anode pads 4510, 4520 and 4530, first, second and third pixel electrodes 5220, 5320, and 5420, first, second and third light emitting layers 6100, 6200 and 6300, a common electrode 7000, a encapsulation layer TFE, a bank layer BK, first and second color conversion layers CCL1 and CCL2, a transmission layer LTL, a refraction layer LR, first, second and third color filters CF1, CF2 and CF3, and a second substrate SUB2. However, the display device 10 described with reference to FIG. 13 may be substantially the same as the display device 10 described with reference to FIG. 9 except for the first, second and third pixel electrodes 5220, 5320 and 5420.

The first pixel electrode 5220 may be connected to the first anode pad 4510 through a contact hole formed by removing a first portion of the via insulating layer VIA. The second pixel electrode 5320 may be connected to the second anode pad 4520 through a contact hole formed by removing a second portion of the via insulating layer VIA. The third pixel electrode 5420 may be connected to the third anode pad 4530 through a contact hole formed by removing a third portion of the via insulating layer VIA.

The first pixel electrode 5220, the third light emitting layer 6300 and the common electrode 7000 may constitute a third light emitting diode ED3. The second pixel electrode 5320, the first light emitting layer 6100 and the common electrode 7000 may constitute a first light emitting diode ED1. The third pixel electrode 5420, the second light emitting layer 6200 and the common electrode 7000 may constitute a second light emitting diode ED2.

Figure 14:
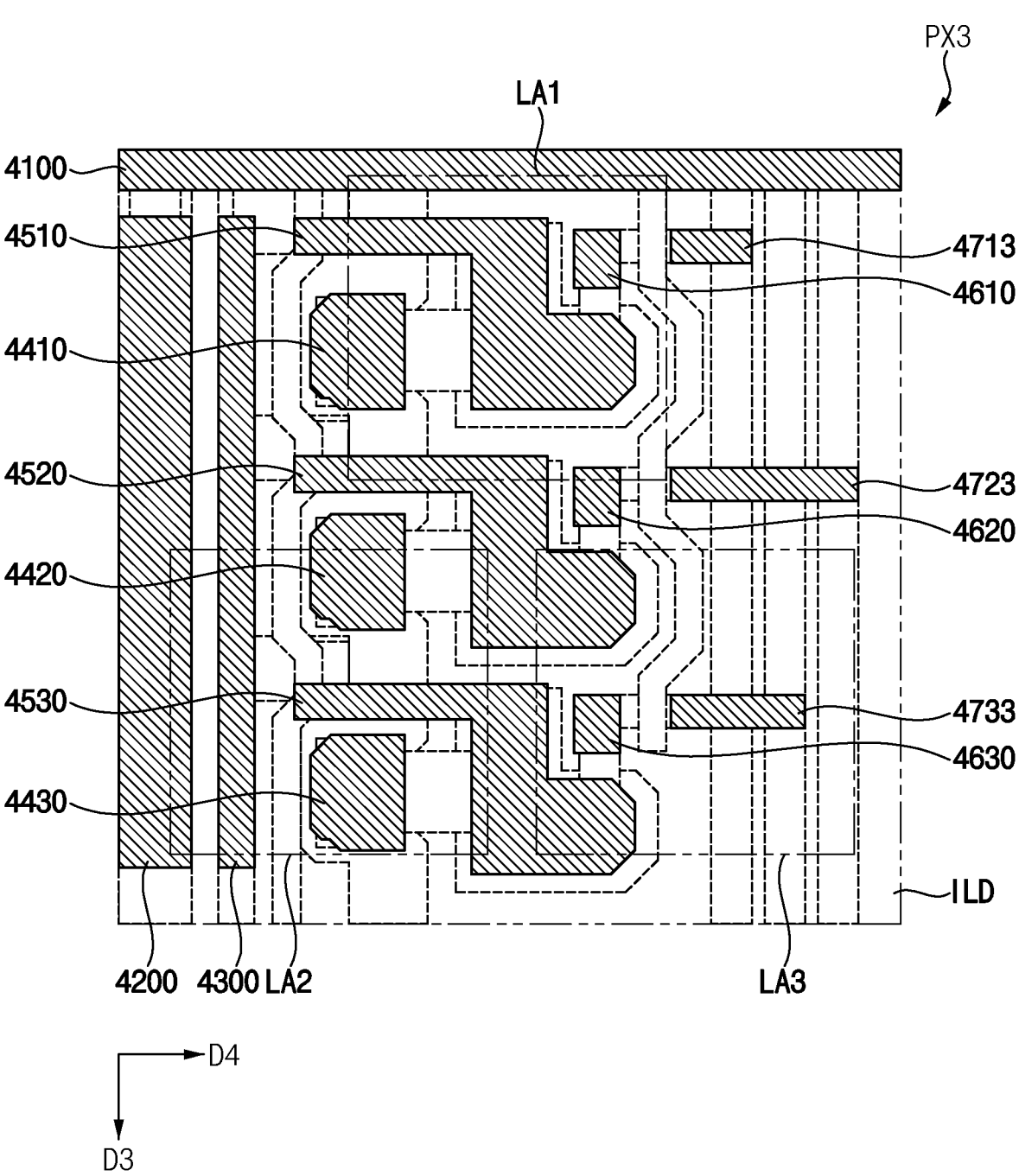
FIG. 14 is a layout view illustrating still another example of FIG. 7.
Figure 15:
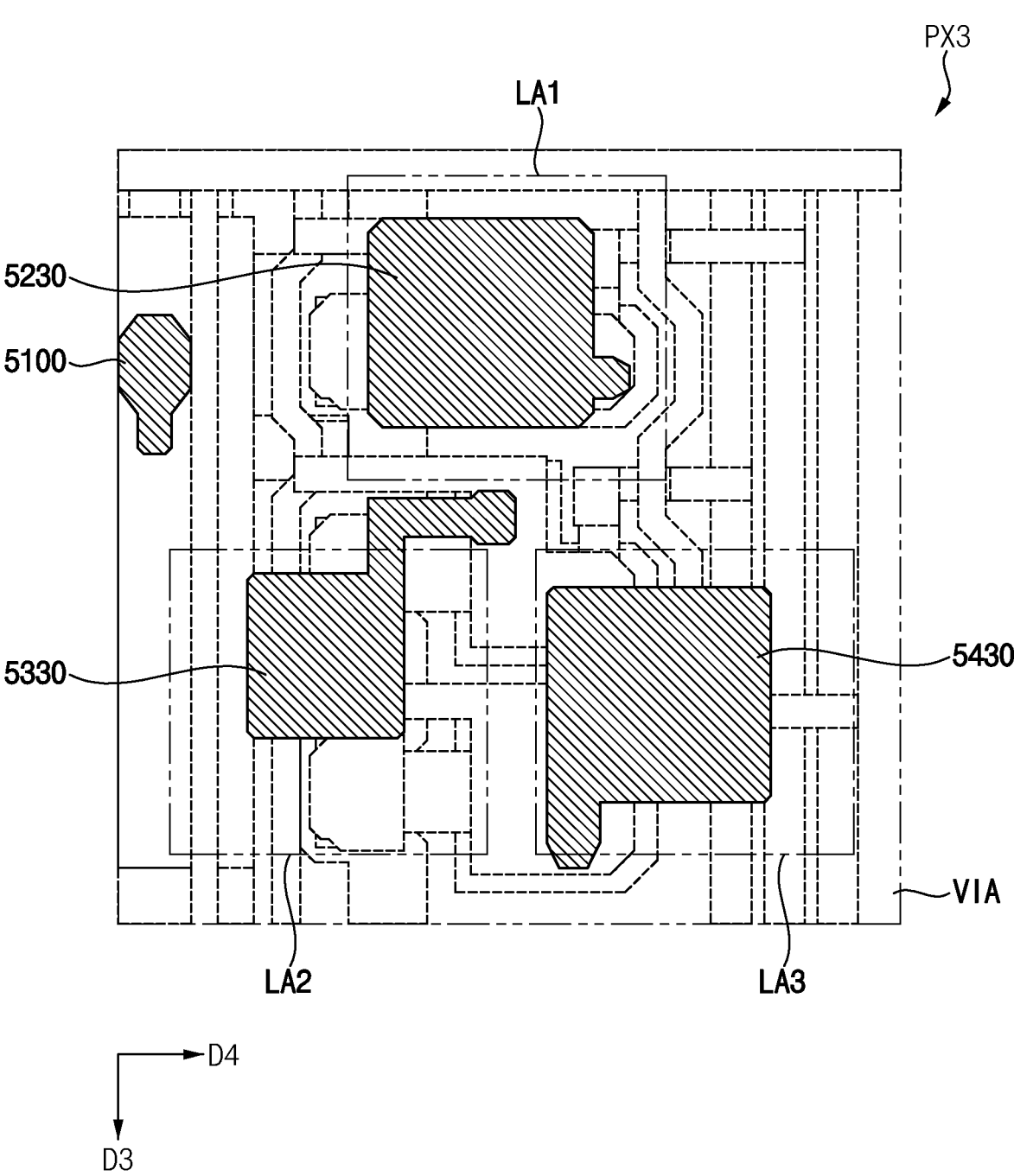
FIG. 15 is a layout view illustrating still another example of FIG. 8.

FIG. 14 is a layout view illustrating still another example of FIG. 7. FIG. 15 is a layout view illustrating still another example of FIG. 8. For example, FIGS. 14 and 15 may be views for illustrating a plurality of conductive patterns included in the third pixel PX3.

Referring to FIGS. 14 and 15, a third conductive pattern 4000 may be disposed on an interlayer insulating layer ILD. The third conductive pattern 4000 may include a gate connection line 4100, a common voltage connection pattern 4200, an initialization voltage connection pattern 4300, a first driving voltage connection pattern 4410, a second driving voltage connection pattern 4420, a third driving voltage connection pattern 4430, a first anode pad 4510, a second anode pad 4520, a third anode pad 4530, a first connection pattern 4610, a second connection pattern 4620, a third connection pattern 4630, a first data pattern 4713, a second data pattern 4723, and a third data pattern 4733.

A via insulating layer VIA may be disposed on the third conductive pattern 4000 and may cover the third conductive pattern 4000. A fourth conductive pattern 5000 may be disposed on the via insulating layer VIA, and may include a common voltage pattern 5100, a first pixel electrode 5230, a second pixel electrode 5330, and a third pixel electrode 5430.

However, the third pixel PX3 described with reference to FIGS. 14 and 15 may be substantially the same as the first pixel PX1 described with reference to FIGS. 4, 5, 6, 7 and 8 except for the first data pattern 4713, the second data pattern 4723, the third data pattern 4733, the first pixel electrode 5230, the second pixel electrode 5330, and the third pixel electrode 5430.

In an embodiment, in the third pixel PX3, unlike the first pixel PX1, the first light emitting area LA1 may emit red light, the second light emitting area LA2 may emit blue light, and the third light emitting area LA3 may emit green light, but is not limited thereto.

The first data pattern 4713, the second data pattern 4723 and the third data pattern 4733 may be arranged along the third direction D3.

The first data pattern 4713 may contact the first data line 1510 and the first active pattern 2310 through at least one contact hole. The first data pattern 4713 may transmit the first data voltage from the first data line 1510 to the first active pattern 2310. In other words, the first data pattern 4713 may transmit the first data voltage from the first data line 1510 to the first light emitting area LA1.

The second data pattern 4723 may contact the third data line 1530 and the second active pattern 2320 through at least one contact hole. The second data pattern 4723 may transmit the third data voltage from the third data line 1530 to the second active pattern 2320. In other words, the second data pattern 4723 may transmit the third data voltage from the third data line 1530 to the second light emitting area LA2.

The third data pattern 4733 may contact the second data line 1520 and the third active pattern 2330 through at least one contact hole. The third data pattern 4733 may transmit the second data voltage from the second data line 1520 to the third active pattern 2330. In other words, the third data pattern 4733 may transmit the second data voltage from the second data line 1520 to the third light emitting area LA3.

The first pixel electrode 5230 may contact the first anode pad 4510 through at least one contact hole, and may receive the initialization voltage VINT or the driving current through the first anode pad 4510. The driving current may be generated based on the first data voltage transmitted through the first data pattern 4713.

The second pixel electrode 5330 may contact the second anode pad 4520 through at least one contact hole, and may receive the initialization voltage VINT or the driving current through the second anode pad 4520. The driving current may be generated based on the third data voltage transmitted through the second data pattern 4723.

The third pixel electrode 5430 may contact the third anode pad 4530 through at least one contact hole, and may receive the initialization voltage VINT or the driving current through the third anode pad 4530. The driving current may be generated based on the second data voltage transmitted through the third data pattern 4733.

FIG. 16 is a cross-sectional view taken along line III-III' of FIG. 3.

Referring to FIG. 16, the display device 10 may include a first substrate SUB1, first, second and third capacitor electrode patterns 1410, 1420 and 1430, fourth, fifth and sixth semiconductor patterns 2210, 2220 and 2230, first, second and third gate electrodes 3410, 3420 and 3430, first, second and third anode pads 4510, 4520 and 4530, first, second and third pixel electrodes 5230, 5330, and 5430, first, second and third light emitting layers 6100, 6200 and 6300, a common electrode 7000, a encapsulation layer TFE, a bank layer BK, first and second color conversion layers CCL1 and CCL2, a transmission layer LTL, a refraction layer LR, first, second and third color filters CF1, CF2 and CF3, and a second substrate SUB2. However, the display device 10 described with reference to FIG. 16 may be substantially the same as the display device 10 described with reference to FIG. 9 except for the first, second and third pixel electrodes 5230, 5330 and 5430.

The first pixel electrode 5230 may be connected to the first anode pad 4510 through a contact hole formed by removing a first portion of the via insulating layer VIA. The second pixel electrode 5330 may be connected to the second anode pad 4520 through a contact hole formed by removing a second portion of the via insulating layer VIA. The third pixel electrode 5430 may be connected to the third anode pad 4530 through a contact hole formed by removing a third portion of the via insulating layer VIA.

The first pixel electrode 5230, the second light emitting layer 6200 and the common electrode 7000 may constitute a second light emitting diode ED2. The second pixel electrode 5330, the third light emitting layer 6300 and the common electrode 7000 may constitute a third light emitting diode ED3. The third pixel electrode 5430, the first light emitting layer 6100 and the common electrode 7000 may constitute a first light emitting diode ED1.

As the first light emitting area LA1 included in each of the first, second and third pixels PX1, PX2 and PX3 emits light of different colors from each other, the second light emitting area LA2 included in each of the first, second and third pixels PX1, PX2 and PX3 emits light of different colors from each other, and the third light emitting area LA3 included in each of the first, second and third pixels PX1, PX2 and PX3 emits light of different colors from each other, a color tinting phenomenon occurring at a boundary of an image displayed in a display area of the display device 10 may be improved.

Accordingly, a boundary of a white shape in a black background may be displayed in white, a boundary of a black shape in a white background may be displayed in black, and it is possible to implement text having a boundary with improved color tinting phenomenon. Accordingly, display quality of the display device 10 may be improved.

FIGS. 17, 18, 19, 20 and 21 are plan views for illustrating a display device according to another embodiment.

A display device 20 described with reference to FIGS. 17, 18, 19, 20 and 21 may be substantially the same as the display device 10 described with reference to FIG. 3 except for the shape of each of the first, second and third light emitting areas LA1, LA2 and LA3.

Figure 17:
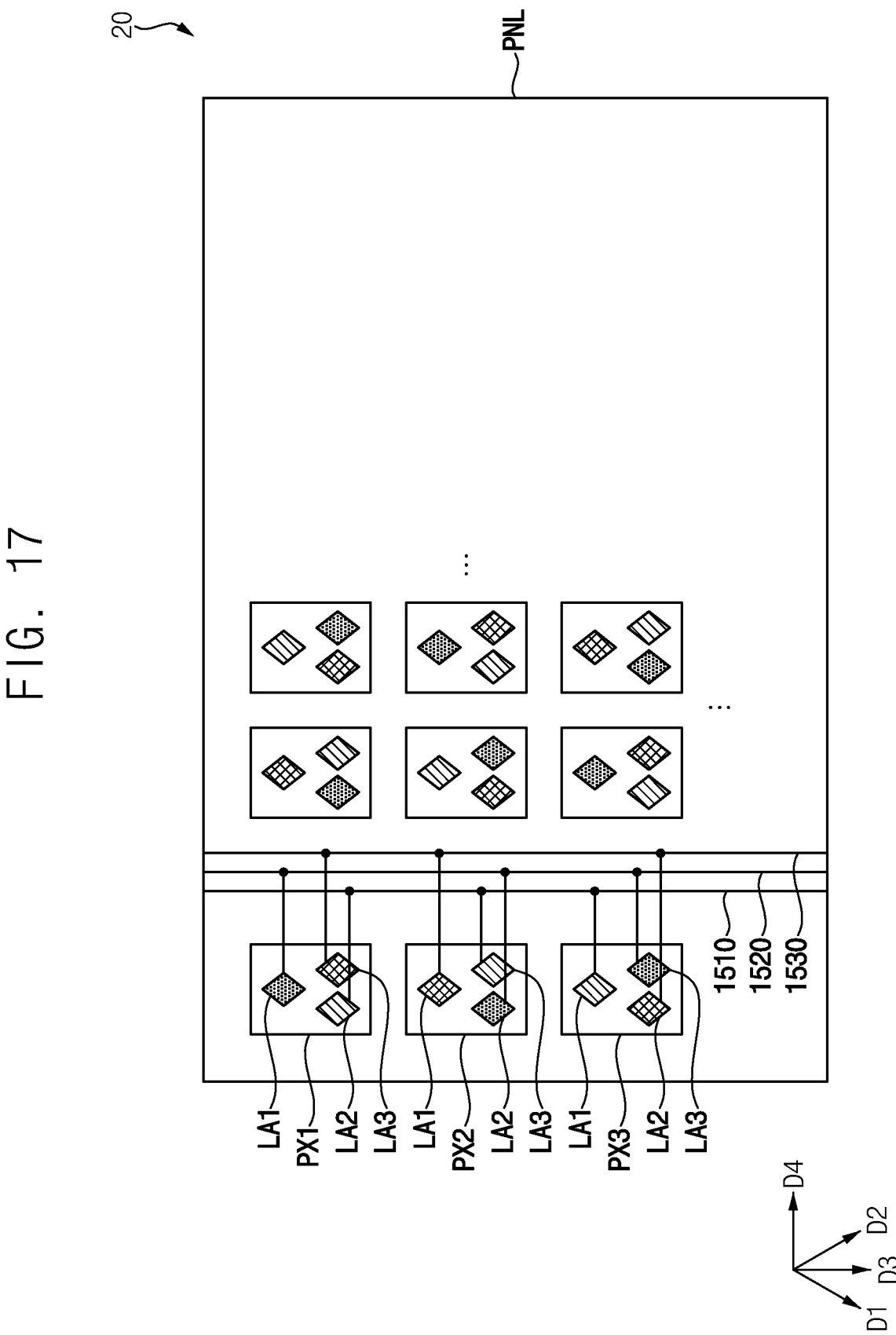

Referring to FIG. 17, the display device 20 according to another embodiment of the present disclosure may include a display panel PNL. The display panel PNL may include a first pixel PX1, a second pixel PX2 and a third pixel PX3. Each of the first, second and third pixels PX1, PX2 and PX3 may include first, second and third light emitting areas LA1, LA2 and LA3. The display panel PNL may include a first data line 1510, a second data line 1520 and a third data line 1530, and the first, second and third light emitting areas LA1, LA2 and LA3 may receive a data voltage DATA through the first, second and third data lines 1510, 1520 and 1530, respectively.

Each of the first, second and third light emitting areas LA1, LA2 and LA3 may have a polygonal shape. For example, each of the first, second and third light emitting areas LA1, LA2 and LA3 may have a rhombic planar shape.

Figure 18:
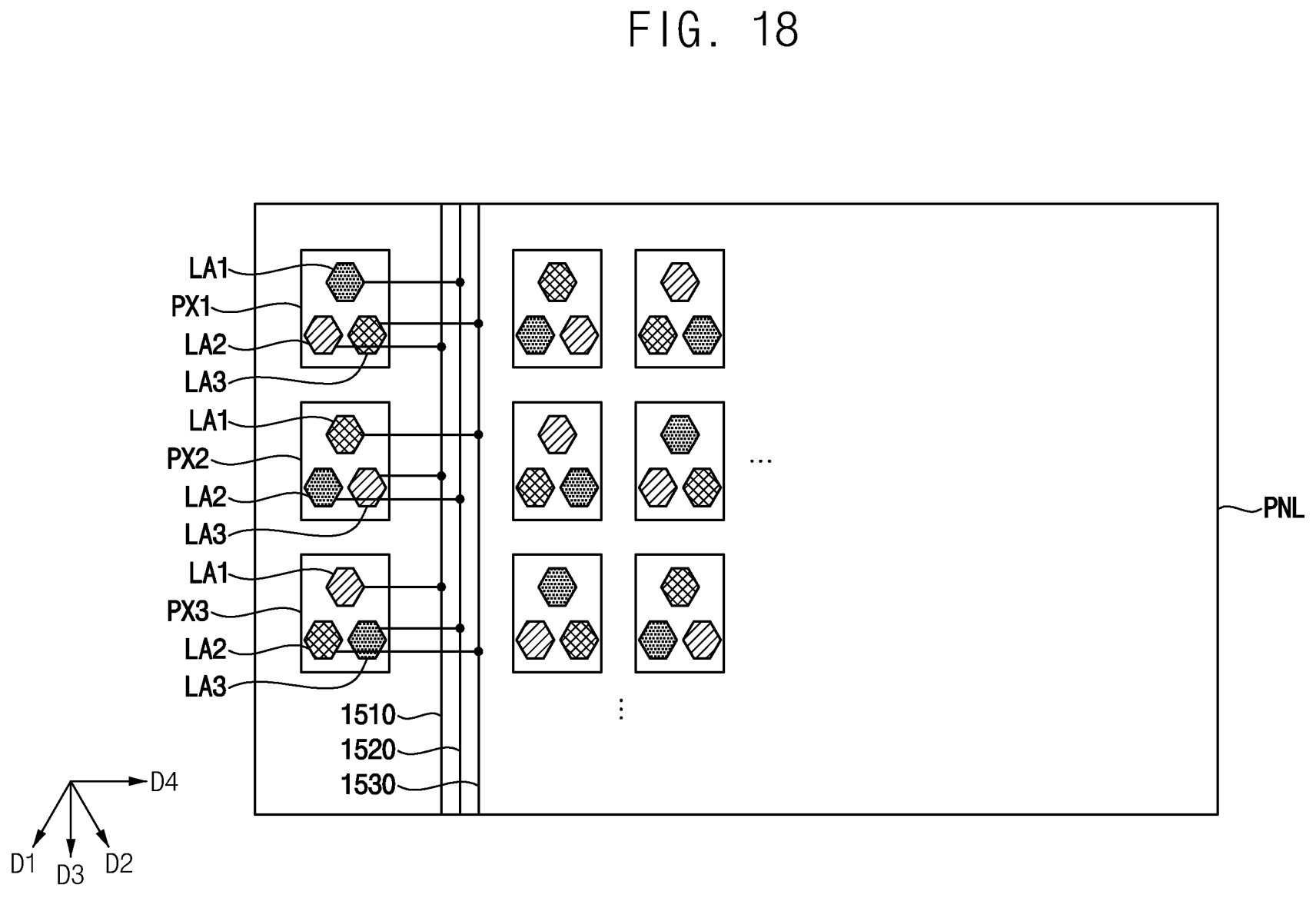

Referring to FIG. 18, each of the first, second and third light emitting areas LA1, LA2 and LA3 may have a polygonal shape. For example, each of the first, second and third light emitting areas LA1, LA2 and LA3 may have a hexagonal planar shape.

Figure 19:
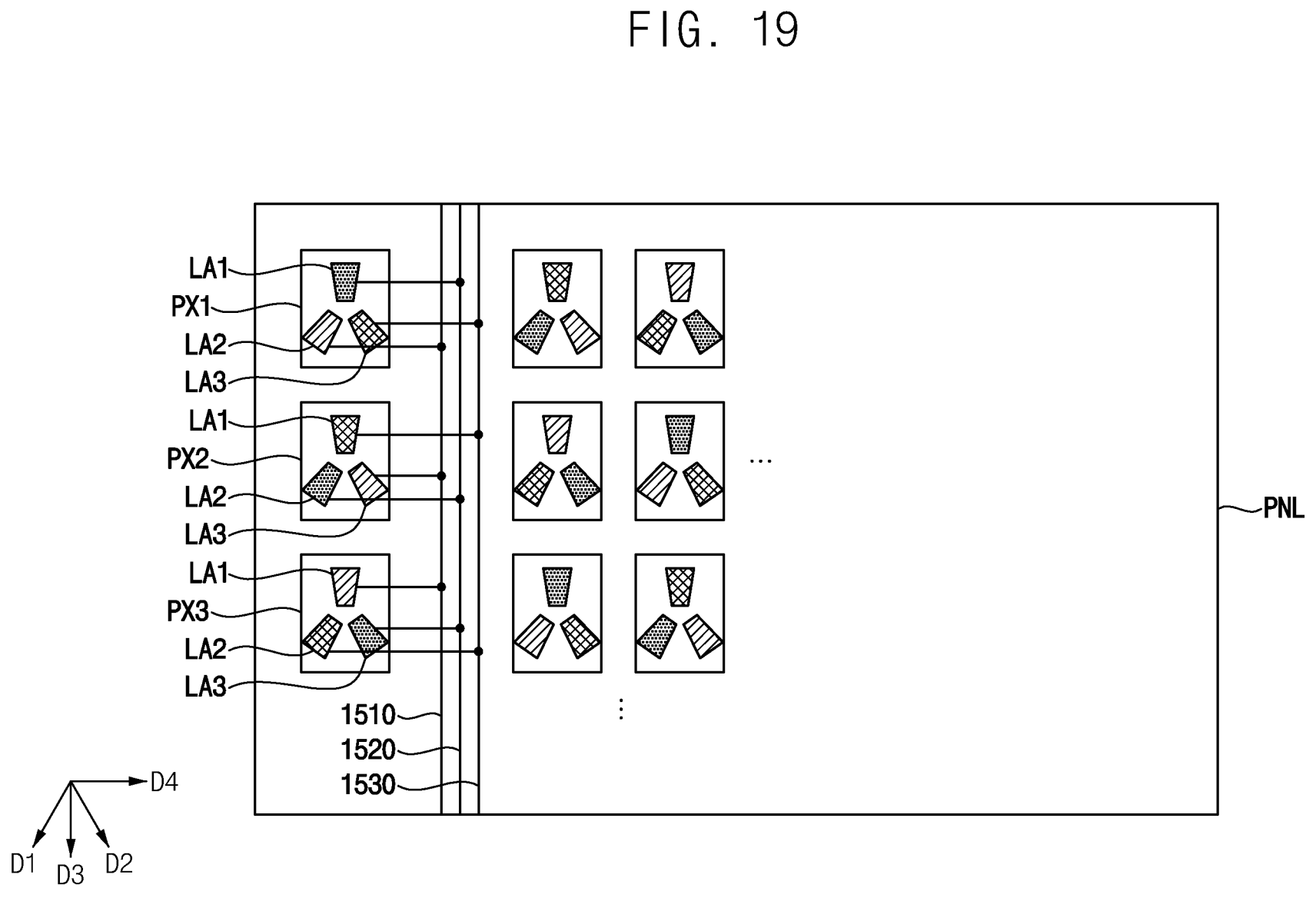

Referring to FIG. 19, each of the first, second and third light emitting areas LA1, LA2 and LA3 may have a polygonal shape. For example, each of the first, second and third light emitting areas LA1, LA2 and LA3 may have a trapezoidal planar shape.

Figure 20:
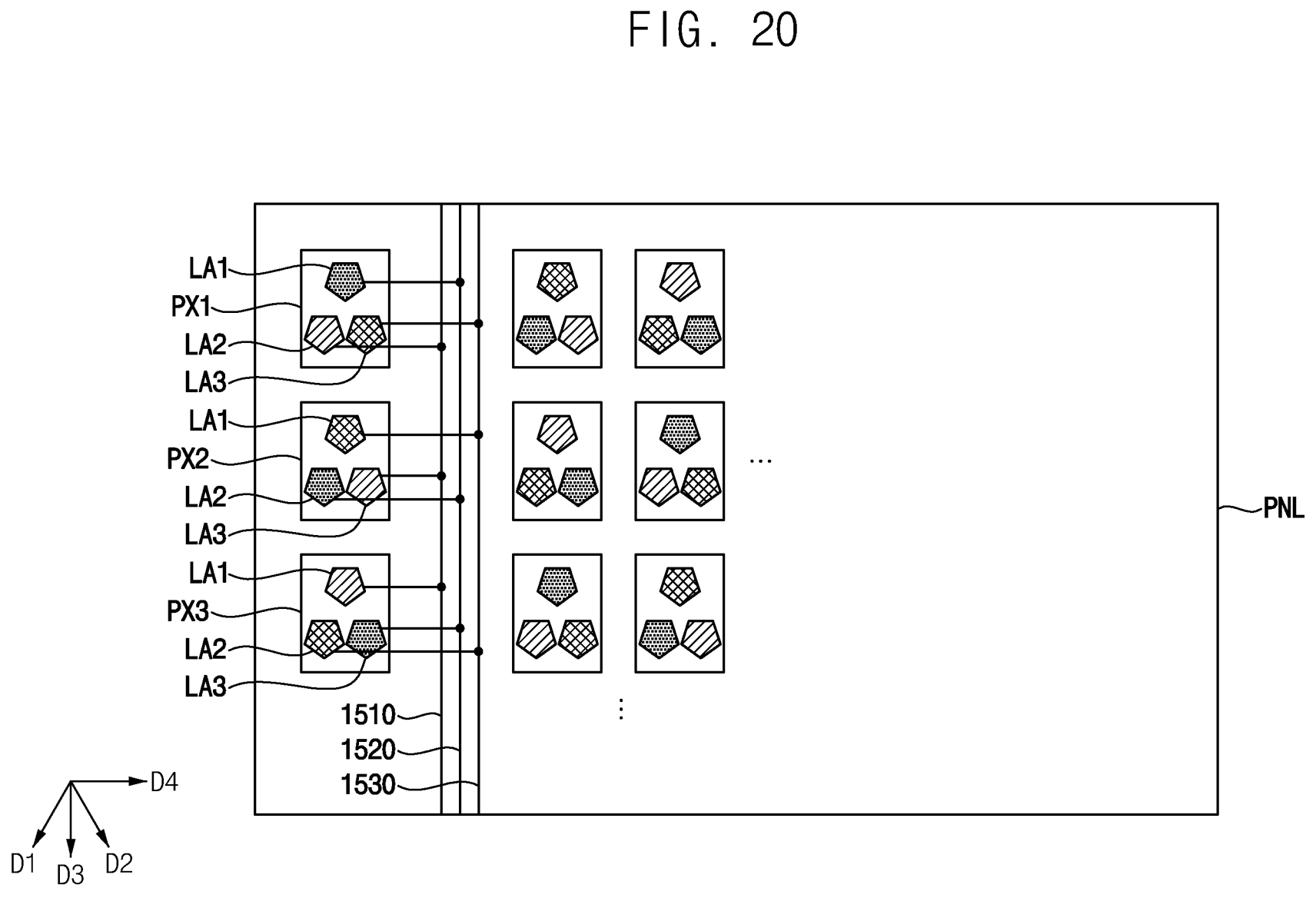

Referring to FIG. 20, each of the first, second and third light emitting areas LA1, LA2 and LA3 may have a polygonal shape. For example, each of the first, second and third light emitting areas LA1, LA2 and LA3 may have a pentagonal planar shape.

Figure 21:
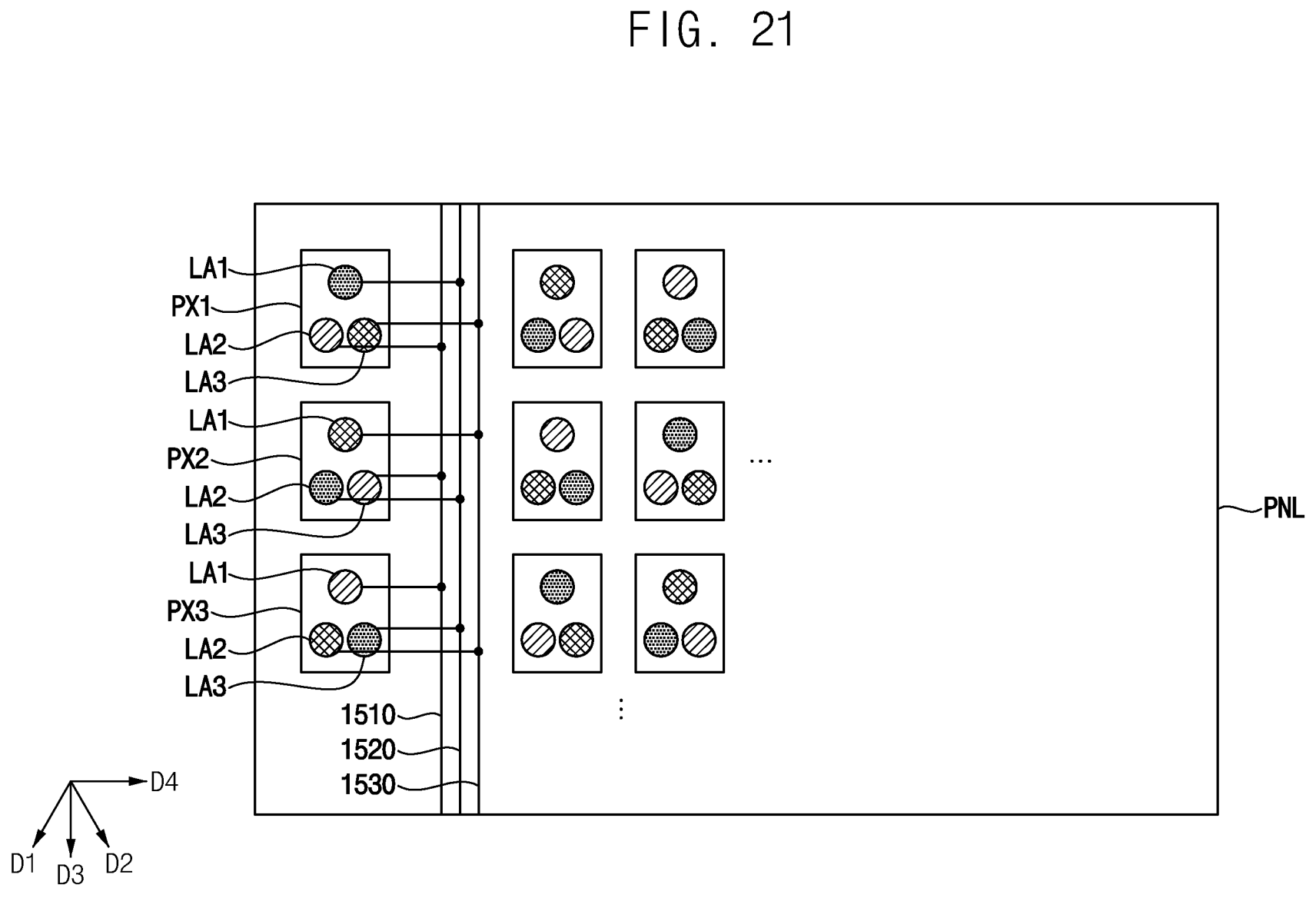

Referring to FIG. 21, each of the first, second and third light emitting areas LA1, LA, and LA3 may have a circular shape.

Figure 22:
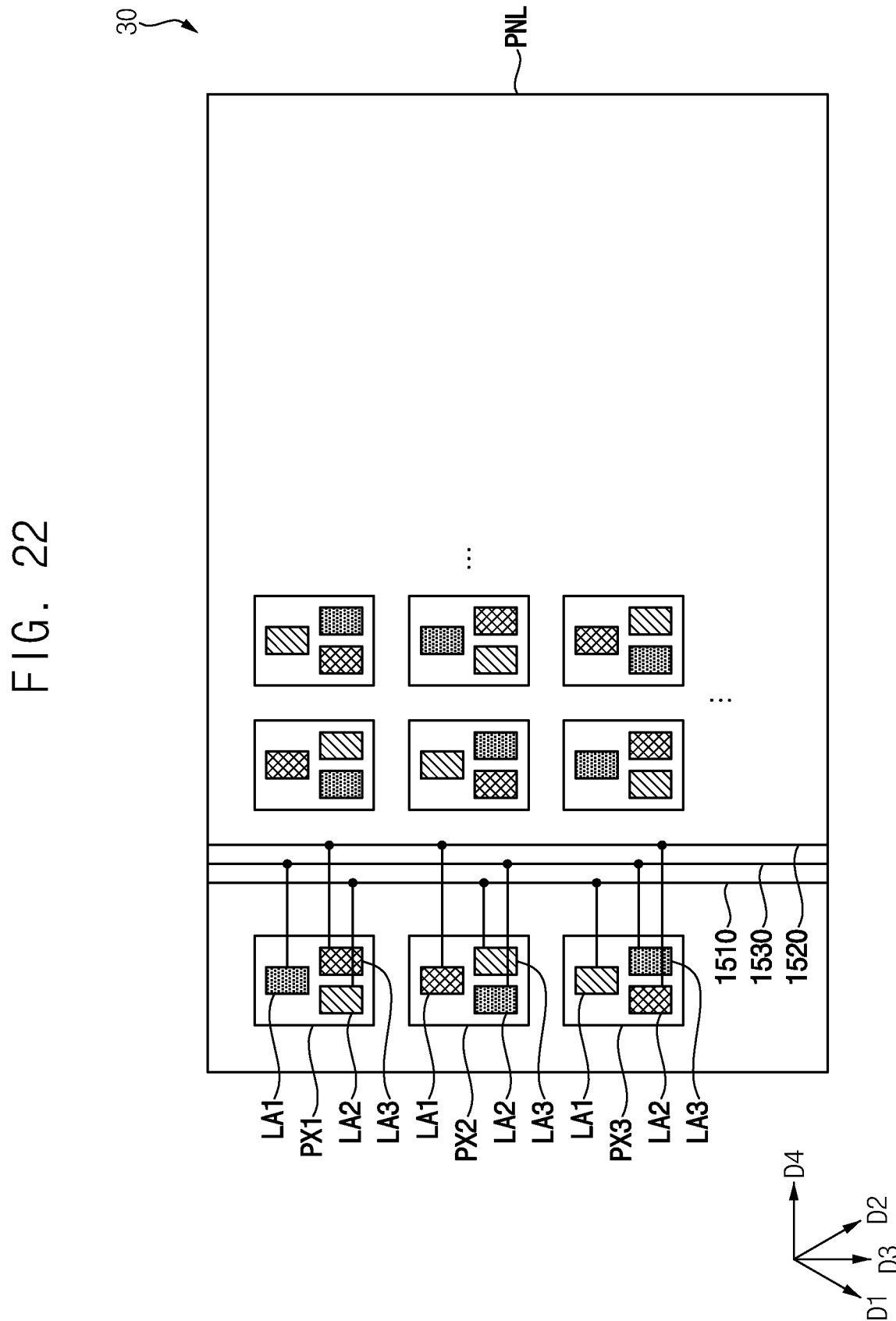
FIG. 22 is a plan view for illustrating a display device according to still another embodiment.

FIG. 22 is a plan view for illustrating a display device according to still another embodiment.

Referring to FIG. 22, a display device 30 according to still another embodiment of the present disclosure may include a display panel PNL. The display panel PNL may include a first pixel PX1, a second pixel PX2 and a third pixel PX3. Each of the first, second and third pixels PX1, PX2 and PX3 may include first, second and third light emitting areas LA1, LA2 and LA3. The display panel PNL may include a first data line 1510, a second data line 1520, and a third data line 1530, and the first, second and third light emitting areas LA1, LA2 and LA3 may receive a data voltage DATA through the first, second and third data lines 1510, 1520, and 1530, respectively.

However, the display device 30 described with reference to FIG. 22 may be substantially the same as the display device 10 described with reference to FIG. 3 except for the arrangement of the second data line 1520 and the third data line 1530.

The first data line 1510 may be disposed on a first substrate SUB1 and may extend in a third direction D3. The third data line 1530 may be disposed on the first substrate SUB1, may extend in the third direction D3, and may be disposed adjacent to the first data line 1510 in a fourth direction D4 crossing the third direction D3. The second data line 1520 may be disposed on the first substrate SUB1, may extend in the third direction D3, and may be disposed adjacent to the third data line 1530 in the fourth direction D4.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
a substrate;
a first pixel disposed on the substrate;
a second pixel disposed on the substrate adjacent to the first pixel; and
a first data line, a second data line and a third data line disposed on the substrate,
wherein each of the first pixel and the second pixel includes a first light emitting area including a first active pattern, a second light emitting area disposed adjacent to the first light emitting area in a first direction and including a second active pattern, and a third light emitting area disposed adjacent to the first light emitting area in a second direction crossing the first direction and including a third active pattern,
wherein the first light emitting area included in the first pixel and the first light emitting area included in the second pixel emit light of different colors, the second light emitting area included in the first pixel and the second light emitting area included in the second pixel emit light of different colors, and the third light emitting area included in the first pixel and the third light emitting area included in the second pixel emit light of different colors, and wherein:

the first data line is connected to the second active pattern included in the first pixel and the third active pattern included in the second pixel;

the second data line is connected to the first active pattern included in the first pixel and the second active pattern included in the second pixel; and the third data line is connected to the third active pattern included in the first pixel and the first active pattern included in the second pixel.

2. The display device of claim 1, wherein the first light emitting area included in the first pixel and the second light emitting area included in the second pixel emit light of a same color as each other, the second light emitting area included in the first pixel and the third light emitting area included in the second pixel emit light of the same color as each other, and the third light emitting area included in the first pixel and the first light emitting area included in the second pixel emit light of the same color as each other.

3. The display device of claim 2, wherein the first light emitting area included in the first pixel and the second light emitting area included in the second pixel emit green light, the second light emitting area included in the first pixel and the third light emitting area included in the second pixel emit red light, and the third light emitting area included in the first pixel and the first light emitting area included in the second pixel emit blue light.

4. The display device of claim 2, wherein each of the first pixel and the second pixel further includes:

a first pixel electrode disposed in the first light emitting area;

a second pixel electrode disposed in the second light emitting area; and a third pixel electrode disposed in the third light emitting area.

5. The display device of claim 4, wherein:

the first active pattern is connected to the first pixel electrode;

the second active pattern is connected to the second pixel electrode; and the third active pattern is connected to the third pixel electrode.

6. The display device of claim 5, wherein the second pixel is disposed adjacent to the first pixel in a third direction, each of the first data line, the second data line and the third data line extends in the third direction, the second data line is disposed adjacent to the first data line in a fourth direction crossing the third direction, and the third data line is disposed adjacent to the second data line in the fourth direction.

7. The display device of claim 5, wherein the second pixel is disposed adjacent to the first pixel in a third direction, each of the first data line, the second data line and the third data line extends in the third direction, the third data line is disposed adjacent to the first data line in a fourth direction crossing the third direction, and the second data line is disposed adjacent to the third data line in the fourth direction.

8. The display device of claim 5, wherein each of the first active pattern, the second active pattern and the third active pattern includes an oxide semiconductor.

9. The display device of claim 2, further comprising:

a first light emitting diode disposed in each of the first light emitting area included in the first pixel and the second light emitting area included in the second pixel;

a second light emitting diode disposed in each of the second light emitting area included in the first pixel and the third light emitting area included in the second pixel; and a third light emitting diode disposed in each of the third light emitting area included in the first pixel and the first light emitting area included in the second pixel.

10. The display device of claim 9, wherein the first light emitting diode, the second light emitting diode and the third light emitting diode emit light of a same color as each other.

11. The display device of claim 9, wherein the first light emitting diode, the second light emitting diode and the third light emitting diode emit light of different colors.

12. The display device of claim 9, further comprising:

a first color conversion layer disposed on the first light emitting diode;

a second color conversion layer disposed on the second light emitting diode; and a transmission layer disposed on the third light emitting diode.

13. The display device of claim 12, further comprising:

a first color filter disposed on the first color conversion layer;

a second color filter disposed on the second color conversion layer; and a third color filter disposed on the transmission layer.

14. The display device of claim 1, further comprising:

a third pixel disposed on the substrate adjacent to the second pixel, wherein the first light emitting area included in the first pixel and the third light emitting area included in the third pixel emit light of a same color as each other, the second light emitting area included in the first pixel and the first light emitting area included in the third pixel emit light of the same color, and the third light emitting area included in the first pixel and the second light emitting area included in the third pixel emit light of the same color as each other.

15. The display device of claim 14, wherein the first light emitting area included in the first pixel and the third light emitting area included in the third pixel emit green light, the second light emitting area included in the first pixel and the first light emitting area included in the third pixel emit red light, and the third light emitting area included in the first pixel and the second light emitting area included in the third pixel emit blue light.

16. The display device of claim 14, wherein each of the first pixel, the second pixel, and the third pixel further includes:

a first pixel electrode disposed in the first light emitting area;

a second pixel electrode disposed in the second light emitting area;

a third pixel electrode disposed in the third light emitting area;

wherein:

the first active pattern is connected to the first pixel electrode;

the second active pattern is connected to the second pixel electrode; and the third active pattern is connected to the third pixel electrode.

17. The display device of claim 16, wherein:

the first data line is further connected to the first active pattern included in the third pixel;

the second data line is further connected to the third active pattern included in the third pixel; and the third data line is further connected to the second active pattern included in the third pixel.

18. The display device of claim 1, wherein each of the first light emitting area, the second light emitting area and the third light emitting area has a polygonal shape.

19. The display device of claim 1, wherein each of the first light emitting area, the second light emitting area and the third light emitting area has a circular shape.

\* \* \* \* \*